United States Patent
Huang et al.

(10) Patent No.: US 11,469,772 B2
(45) Date of Patent: Oct. 11, 2022

(54) METHOD, SYSTEM AND PROGRAM PRODUCT FOR MASK-BASED COMPRESSION OF A SPARSE MATRIX

(71) Applicants: Joshua Huang, Cupertino, CA (US); Hsilin Huang, Cupertino, CA (US)

(72) Inventors: Joshua Huang, Cupertino, CA (US); Hsilin Huang, Cupertino, CA (US)

( * ) Notice: Subject to any disclaimer, the term of this patent is extended or adjusted under 35 U.S.C. 154(b) by 298 days.

(21) Appl. No.: 16/773,976

(22) Filed: Jan. 27, 2020

(65) Prior Publication Data
US 2020/0228136 A1 Jul. 16, 2020

Related U.S. Application Data

(63) Continuation-in-part of application No. 15/485,036, filed on Apr. 11, 2017, now Pat. No. 10,565,207.

(51) Int. Cl.
*H03M 7/30* (2006.01)
*G06F 13/40* (2006.01)
*G06F 3/06* (2006.01)

(52) U.S. Cl.
CPC ........ *H03M 7/3066* (2013.01); *G06F 3/0608* (2013.01); *G06F 3/0661* (2013.01); *G06F 3/0673* (2013.01); *G06F 13/4027* (2013.01)

(58) Field of Classification Search
CPC .. G06F 13/4027; G06F 3/0608; G06F 3/0661; G06F 3/0673; H03M 7/3066
USPC ........................................................ 707/693
See application file for complete search history.

(56) References Cited

U.S. PATENT DOCUMENTS

| 5,206,822 | A | * | 4/1993 | Taylor | G06F 9/383 708/607 |
|---|---|---|---|---|---|
| 6,128,406 | A | * | 10/2000 | Ostrovsky | G06T 9/005 382/166 |
| 6,694,343 | B2 | * | 2/2004 | Forrest | G06F 17/12 708/520 |
| 8,612,723 | B2 | * | 12/2013 | Burkart | G06F 12/0615 711/217 |
| 8,775,495 | B2 | * | 7/2014 | Lumsdaine | G06K 9/6249 708/607 |
| 10,180,928 | B2 | * | 1/2019 | Nurvitadhi | G06F 17/16 |
| 2005/0093873 | A1 | * | 5/2005 | Paltashev | G06T 9/00 345/581 |

(Continued)

FOREIGN PATENT DOCUMENTS

WO WO-2008110633 A1 * 9/2008 ......... G06F 9/30043

*Primary Examiner* — Sheree N Brown
(74) *Attorney, Agent, or Firm* — Ariel S. Bentolila; Bay Area IP Group, LLC

(57) ABSTRACT

A method, system, and program product accesses chunks of data identifying data elements. A mask is used to identify a position of the data elements that have zero values and that have non-zero values. The data elements are processed based on the mask. For compression of data, data elements in chunks of data that have zero values and that have non-zero values are determined. A mask is used to identify a position of the data elements that have zero values and that have non-zero values. The data elements in the chunks of data having zero values are removed. The data elements having non-zero values are packed into the chunks to form the compressed data. For decompressing the data, zero-value data elements are added in positions in the chunks of data according to the mask to form uncompressed data.

20 Claims, 11 Drawing Sheets

(56) References Cited

U.S. PATENT DOCUMENTS

| | | | |
|---|---|---|---|
| 2007/0198621 A1* | 8/2007 | Lumsdaine | G06K 9/6249 |
| | | | 708/200 |
| 2015/0228256 A1* | 8/2015 | Huang | H04N 19/42 |
| | | | 345/532 |
| 2015/0242484 A1* | 8/2015 | Zhao | G06F 16/22 |
| | | | 707/755 |
| 2015/0379054 A1* | 12/2015 | Kernert | G06F 16/221 |
| | | | 707/625 |
| 2016/0035128 A1* | 2/2016 | Zhao | G06T 1/20 |
| | | | 345/522 |
| 2016/0259826 A1* | 9/2016 | Acar | G06F 16/9535 |
| 2017/0168990 A1* | 6/2017 | Kernert | G06F 17/16 |
| 2018/0189234 A1* | 7/2018 | Nurvitadhi | G06F 9/30036 |
| 2018/0189239 A1* | 7/2018 | Nurvitadhi | G06F 9/30036 |
| 2018/0189675 A1* | 7/2018 | Nurvitadhi | G06F 16/2237 |

* cited by examiner

METHOD, SYSTEM AND PROGRAM PRODUCT FOR MASK-BASED COMPRESSION OF A SPARSE MATRIX

CROSS-REFERENCE TO RELATED APPLICATIONS

The present continuation-in-part patent application claims priority benefit under 35 U.S.C. 120 of the U.S. nonprovisional patent application Ser. No. 15/485,036 entitled "A Method, System and Program Product for Mask-Based Compression of a Sparse Matrix", filed on 11 Apr. 2017, which further claims priority to U.S. provisional application for patent Ser. No. 62/321,683 entitled "MASKED BASED COMPRESSION SCHEME AND ZERO-SKIPPING OPERATION FOR ARTIFICIAL INTELLIGENCE", filed on 12 Apr. 2016, provisional patent Ser. No. 62/322,802 entitled "A REVOLUTIONARY INSTRUCTION SEQUENCER OR CONTROLLER WITH MASS OPERATION AND ZERO-SKIPPING FOR ARTIFICIAL INTELLIGENCE", filed on 15 Apr. 2016, and provisional patent Ser. No. 62/323,699 entitled "A REVOLUTIONARY MIMD PROCESSOR TH MAST OPERATION AND ZERO-SKIPPING NAD SIMD PROCESSOR FOR ARTIFICIAL INTELLIGENCE" filed on 17 Apr. 2016 under 35 U.S.C. 119(e). The contents of this/these related patent application(s) is/are incorporated herein by reference for all purposes to the extent that such subject matter is not inconsistent herewith or limiting hereof.

RELATED CO-PENDING U.S. PATENT APPLICATIONS

Not applicable.

FEDERALLY SPONSORED RESEARCH OR DEVELOPMENT

Not applicable.

REFERENCE TO SEQUENCE LISTING, A TABLE, OR A COMPUTER LISTING APPENDIX

Not applicable.

COPYRIGHT NOTICE

A portion of the disclosure of this patent document contains material that is subject to copyright protection by the author thereof. The copyright owner has no objection to the facsimile reproduction by anyone of the patent document or patent disclosure for the purposes of referencing as patent prior art, as it appears in the Patent and Trademark Office, patent file or records, but otherwise reserves all copyright rights whatsoever.

BACKGROUND OF THE RELEVANT PRIOR ART

One or more embodiments of the invention generally relate to machine learning systems. More particularly, certain embodiments of the invention relates to machine learning systems in point of sale systems.

The following background information may present examples of specific aspects of the prior art (e.g., without limitation, approaches, facts, or common wisdom) that, while expected to be helpful to further educate the reader as to additional aspects of the prior art, is not to be construed as limiting the present invention, or any embodiments thereof, to anything stated or implied therein or inferred thereupon.

A typical neural network may use input data and weight to classify an object. The weight and feature map typically may be large. In numerical analysis, a sparse matrix is a matrix in which most of the elements are zero. By contrast, if most of the elements are nonzero, then the matrix is considered dense. The number of zero-valued elements divided by the total number of elements is called the sparsity of the matrix. When storing and manipulating sparse matrices on a computer, it may be beneficial and often necessary to use specialized algorithms and data structures that take advantage of the sparse structure of the matrix. Operations using standard dense-matrix structures and algorithms are believed to be slow and inefficient when applied to large sparse matrices as processing and memory are wasted on the zeroes. Sparse data is by nature more easily compressed and thus require significantly less storage.

The following is an example of a specific aspect in the prior art that, while expected to be helpful to further educate the reader as to additional aspects of the prior art, is not to be construed as limiting the present invention, or any embodiments thereof, to anything stated or implied therein or inferred thereupon. The Compressed Sparse Row (CSR) or Compressed Row Storage (CRS) format represents a matrix by three (one-dimensional) arrays, that respectively contain nonzero values, the extents of rows, and column indices. The Compressed Sparse Column (CSC) is similar to CSR except that values are read first by column, a row index is stored for each value, and column pointers are stored. It is believed that they are may not be very efficient, needing an indirect addressing step for every single scalar operation in a matrix-vector product or preconditioner solve.

In view of the foregoing, it is clear that these traditional techniques are not perfect and leave room for more optimal approaches.

In view of the foregoing, it is clear that these traditional techniques are not perfect and leave room for more optimal approaches.

BRIEF DESCRIPTION OF THE DRAWINGS

The present invention is illustrated by way of example, and not by way of limitation, in the figures of the accompanying drawings and in which like reference numerals refer to similar elements and in which.

Figure 1:
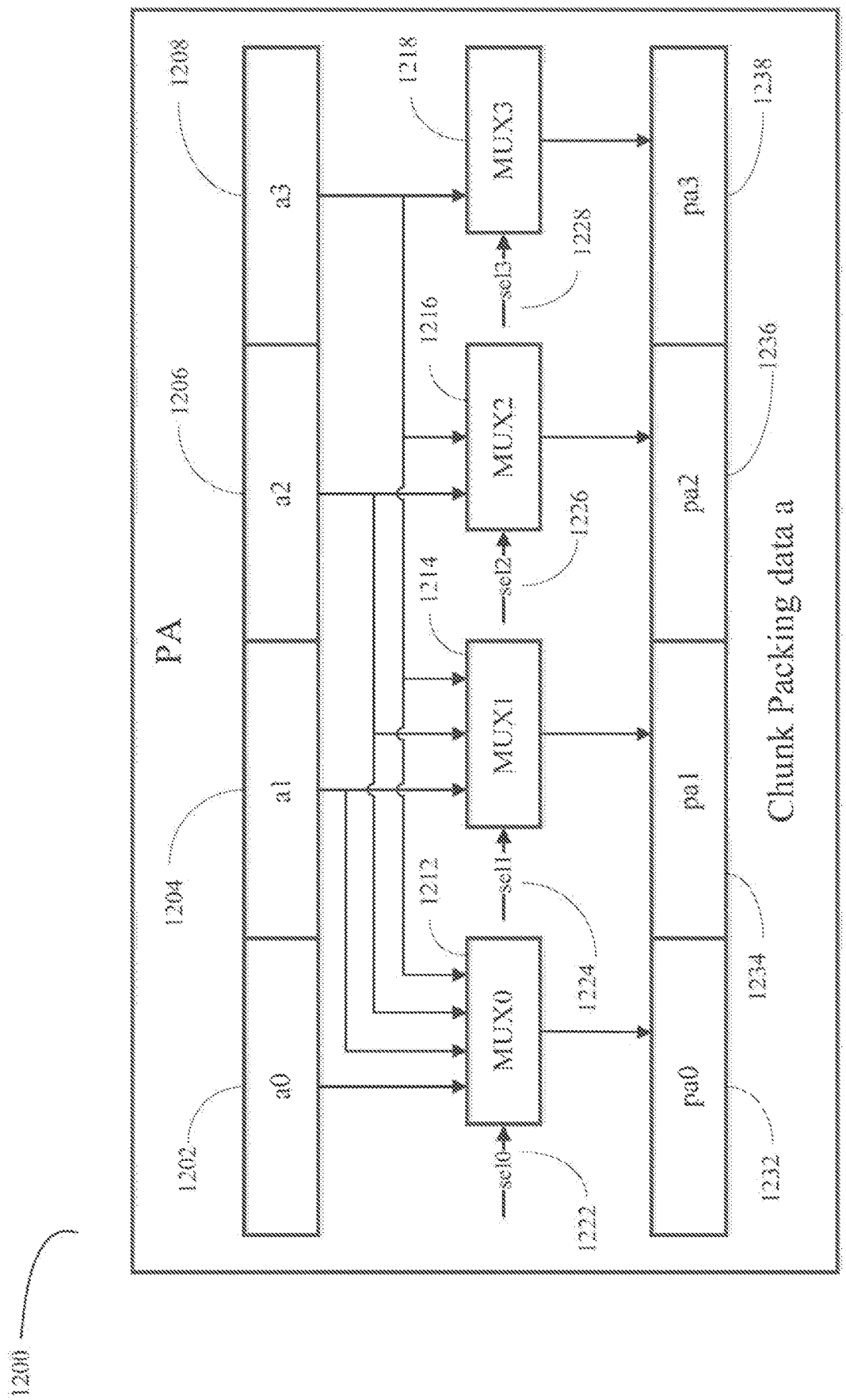
FIG. 1 illustrates chuck packing using data a, in accordance with an embodiment of the present invention.

Unless otherwise indicated illustrations in the figures are not necessarily drawn to scale.

DETAILED DESCRIPTION OF SOME EMBODIMENTS

The present invention is best understood by reference to the detailed figures and description set forth herein.

Embodiments of the invention are discussed below with reference to the Figures. However, those skilled in the art will readily appreciate that the detailed description given herein with respect to these figures is for explanatory purposes as the invention extends beyond these limited embodiments. For example, it should be appreciated that those skilled in the art will, in light of the teachings of the present invention, recognize a multiplicity of alternate and suitable approaches, depending upon the needs of the particular application, to implement the functionality of any given detail described herein, beyond the particular implementation choices in the following embodiments described and shown. That is, there are modifications and variations of the invention that are too numerous to be listed but that all fit within the scope of the invention. Also, singular words should be read as plural and vice versa and masculine as feminine and vice versa, where appropriate, and alternative embodiments do not necessarily imply that the two are mutually exclusive.

It is to be further understood that the present invention is not limited to the particular methodology, compounds, materials, manufacturing techniques, uses, and applications, described herein, as these may vary. It is also to be understood that the terminology used herein is used for the purpose of describing particular embodiments only, and is not intended to limit the scope of the present invention. It must be noted that as used herein and in the appended claims, the singular forms "a," "an," and "the" include the plural reference unless the context clearly dictates otherwise. Thus, for example, a reference to "an element" is a reference to one or more elements and includes equivalents thereof known to those skilled in the art. Similarly, for another example, a reference to "a step" or "a means" is a reference to one or more steps or means and may include sub-steps and subservient means. All conjunctions used are to be understood in the most inclusive sense possible. Thus, the word "or" should be understood as having the definition of a logical "or" rather than that of a logical "exclusive or" unless the context clearly necessitates otherwise. Structures described herein are to be understood also to refer to functional equivalents of such structures. Language that may be construed to express approximation should be so understood unless the context clearly dictates otherwise.

All words of approximation as used in the present disclosure and claims should be construed to mean "approximate," rather than "perfect," and may accordingly be employed as a meaningful modifier to any other word, specified parameter, quantity, quality, or concept. Words of approximation, include, yet are not limited to terms such as "substantial", "nearly", "almost", "about", "generally", "largely", "essentially", "closely approximate", etc.

As will be established in some detail below, it is well settle law, as early as 1939, that words of approximation are not indefinite in the claims even when such limits are not defined or specified in the specification.

For example, see Ex parte Mallory, 52 USPQ 297, 297 (Pat. Off. Bd. App. 1941) where the court said "The examiner has held that most of the claims are inaccurate because apparently the laminar film will not be entirely eliminated. The claims specify that the film is "substantially" eliminated and for the intended purpose, it is believed that the slight portion of the film which may remain is negligible. We are of the view, therefore, that the claims may be regarded as sufficiently accurate."

Note that claims need only "reasonably apprise those skilled in the art" as to their scope to satisfy the definiteness requirement. See, Energy Absorption Sys., Inc. v. Roadway Safety Servs., Inc., Civ. App. 96-1264, slip op. at 10 (Fed. Cir. Jul. 3, 1997) (unpublished) Hybridtech v. Monoclonal Antibodies, Inc., 802 F.2d 1367, 1385, 231 USPQ 81, 94 (Fed. Cir. 1986), cert. denied, 480 U.S. 947 (1987). In addition, the use of modifiers in the claim, like "generally" and "substantial," does not by itself render the claims indefinite. See Seattle Box Co. v. Industrial Crating & Packing, Inc., 731 F.2d 818, 828-29, 221 USPQ 568, 575-76 (Fed. Cir. 1984).

Moreover, the ordinary and customary meaning of terms like "substantially" includes "reasonably close to: nearly, almost, about", connoting a term of approximation. See In re Frye, Appeal No. 2009-006013, 94 USPQ2d 1072, 1077, 2010 WL 889747 (B.P.A.I. 2010) Depending on its usage, the word "substantially" can denote either language of approximation or language of magnitude. Deering Precision Instruments, L.L.C. v. Vector Distribution Sys., Inc., 347 F.3d 1314, 1323 (Fed. Cir. 2003) (recognizing the "dual ordinary meaning of th[e] term ["substantially"] as connoting a term of approximation or a term of magnitude"). Here, when referring to the "substantially halfway" limitation, the Specification uses the word "approximately" as a substitute for the word "substantially" (Fact 4). (Fact 4). The ordinary meaning of "substantially halfway" is thus reasonably close to or nearly at the midpoint between the forwardmost point of the upper or outsole and the rearwardmost point of the upper or outsole.

Similarly, the term 'substantially' is well recognized in case law to have the dual ordinary meaning of connoting a term of approximation or a term of magnitude. See Dana Corp. v. American Axle & Manufacturing, Inc., Civ. App. 04-1116, 2004 U.S. App. LEXIS 18265, *13-14 (Fed. Cir. Aug. 27, 2004) (unpublished). The term "substantially" is commonly used by claim drafters to indicate approximation. See Cordis Corp. v. Medtronic AVE Inc., 339 F.3d 1352, 1360 (Fed. Cir. 2003) ("The patents do not set out any numerical standard by which to determine whether the thickness of the wall surface is 'substantially uniform.' The term 'substantially,' as used in this context, denotes approximation. Thus, the walls must be of largely or approximately uniform thickness."); see also Deering Precision Instruments, LLC v. Vector Distribution Sys., Inc., 347 F.3d 1314, 1322 (Fed. Cir. 2003); Epcon Gas Sys., Inc. v. Bauer Compressors, Inc., 279 F.3d 1022, 1031 (Fed. Cir. 2002). We find that the term "substantially" was used in just such a manner in the claims of the patents-in-suit: "substantially uniform wall thickness" denotes a wall thickness with approximate uniformity.

It should also be noted that such words of approximation as contemplated in the foregoing clearly limits the scope of claims such as saying 'generally parallel' such that the adverb 'generally' does not broaden the meaning of parallel. Accordingly, it is well settled that such words of approximation as contemplated in the foregoing (e.g., like the phrase 'generally parallel') envisions some amount of deviation from perfection (e.g., not exactly parallel), and that such words of approximation as contemplated in the foregoing are descriptive terms commonly used in patent claims to avoid a strict numerical boundary to the specified parameter. To the extent that the plain language of the claims relying on such words of approximation as contemplated in the foregoing are clear and uncontradicted by anything in the written description herein or the figures thereof, it is improper to rely upon the present written description, the figures, or the prosecution history to add limitations to any of the claim of the present invention with respect to such words of approximation as contemplated in the foregoing. That is, under such circumstances, relying on the written description and prosecution history to reject the ordinary and customary meanings of the words themselves is impermissible. See, for example, *Liquid Dynamics Corp.* v. *Vaughan Co.,* 355 F.3d 1361, 69 USPQ2d 1595, 1600-01 (Fed. Cir. 2004). The plain language of phrase 2 requires a "substantial helical flow." The term "substantial" is a meaningful modifier implying "approximate," rather than "perfect." In *Cordis Corp.* v. *Medtronic AVE, Inc.,* 339 F.3d 1352, 1361 (Fed. Cir. 2003), the district court imposed a precise numeric constraint on the term "substantially uniform thickness." We noted that the proper interpretation of this term was "of largely or approximately uniform thickness" unless something in the prosecution history imposed the "clear and unmistakable disclaimer" needed for narrowing beyond this simple-language interpretation. Id. In *Anchor Wall Systems* v. *Rockwood Retaining Walls, Inc.,* 340 F.3d 1298, 1311 (Fed. Cir. 2003)" Id. at 1311. Similarly, the plain language of claim 1 requires neither a perfectly helical flow nor a flow that returns precisely to the center after one rotation (a limitation that arises only as a logical consequence of requiring a perfectly helical flow).

The reader should appreciate that case law generally recognizes a dual ordinary meaning of such words of approximation, as contemplated in the foregoing, as connoting a term of approximation or a term of magnitude; e.g., see *Deering Precision Instruments, L.L.C.* v. *Vector Distrib. Sys., Inc.,* 347 F.3d 1314, 68 USPQ2d 1716, 1721 (Fed. Cir. 2003), cert. denied, 124 S. Ct. 1426 (2004) where the court was asked to construe the meaning of the term "substantially" in a patent claim. Also see *Epcon,* 279 F.3d at 1031 ("The phrase 'substantially constant' denotes language of approximation, while the phrase 'substantially below' signifies language of magnitude, i.e., not insubstantial."). Also, see, e.g., *Epcon Gas Sys., Inc.* v. *Bauer Compressors, Inc.,* 279 F.3d 1022 (Fed. Cir. 2002) (construing the terms "substantially constant" and "substantially below"); *Zodiac Pool Care, Inc.* v. *Hoffinger Indus., Inc.,* 206 F.3d 1408 (Fed. Cir. 2000) (construing the term "substantially inward"); *York Prods., Inc.* v. *Cent. Tractor Farm & Family Ctr.,* 99 F.3d 1568 (Fed. Cir. 1996) (construing the term "substantially the entire height thereof"); *Tex. Instruments Inc.* v. *Cypress Semiconductor Corp.,* 90 F.3d 1558 (Fed. Cir. 1996) (construing the term "substantially in the common plane"). In conducting their analysis, the court instructed to begin with the ordinary meaning of the claim terms to one of ordinary skill in the art. *Prima Tek,* 318 F.3d at 1148. Reference to dictionaries and our cases indicates that the term "substantially" has numerous ordinary meanings. As the district court stated, "substantially" can mean "significantly" or "considerably." The term "substantially" can also mean "largely" or "essentially." Webster's New 20th Century Dictionary 1817 (1983).

Words of approximation, as contemplated in the foregoing, may also be used in phrases establishing approximate ranges or limits, where the end points are inclusive and approximate, not perfect; e.g., see *AK Steel Corp.* v. *Sollac,* 344 F.3d 1234, 68 USPQ2d 1280, 1285 (Fed. Cir. 2003) where it where the court said [W]e conclude that the ordinary meaning of the phrase "up to about 10%" includes the "about 10%" endpoint. As pointed out by AK Steel, when an object of the preposition "up to" is nonnumeric, the most natural meaning is to exclude the object (e.g., painting the wall up to the door). On the other hand, as pointed out by Sollac, when the object is a numerical limit, the normal meaning is to include that upper numerical limit (e.g., counting up to ten, seating capacity for up to seven passengers). Because we have here a numerical limit—"about 10%"—the ordinary meaning is that that endpoint is included.

In the present specification and claims, a goal of employment of such words of approximation, as contemplated in the foregoing, is to avoid a strict numerical boundary to the modified specified parameter, as sanctioned by *Pall Corp.* v. *Micron Separations, Inc.,* 66 F.3d 1211, 1217, 36 USPQ2d 1225, 1229 (Fed. Cir. 1995) where it states "It is well established that when the term "substantially" serves reasonably to describe the subject matter so that its scope would be understood by persons in the field of the invention, and to distinguish the claimed subject matter from the prior art, it is not indefinite." Likewise see *Verve LLC* v. *Crane Cams Inc.,* 311 F.3d 1116, 65 USPQ2d 1051, 1054 (Fed. Cir. 2002). Expressions such as "substantially" are used in patent documents when warranted by the nature of the invention, in order to accommodate the minor variations that may be appropriate to secure the invention. Such usage may well satisfy the charge to "particularly point out and distinctly claim" the invention, 35 U.S.C. § 112, and indeed may be necessary in order to provide the inventor with the benefit of his invention. In *Andrew Corp.* v. *Gabriel Elecs. Inc.,* 847 F.2d 819, 821-22, 6 USPQ2d 2010, 2013 (Fed. Cir. 1988) the court explained that usages such as "substantially equal" and "closely approximate" may serve to describe the invention with precision appropriate to the technology and without intruding on the prior art. The court again explained in *Ecolab Inc.* v. *Envirochem, Inc.,* 264 F.3d 1358, 1367, 60 USPQ2d 1173, 1179 (Fed. Cir. 2001) that "like the term 'about,' the term 'substantially' is a descriptive term commonly used in patent claims to 'avoid a strict numerical boundary to the specified parameter, see *Ecolab Inc.* v. *Envirochem Inc.,* 264 F.3d 1358, 60 USPQ2d 1173, 1179 (Fed. Cir. 2001) where the court found that the use of the term "substantially" to modify the term "uniform" does not render this phrase so unclear such that there is no means by which to ascertain the claim scope.

Similarly, other courts have noted that like the term "about," the term "substantially" is a descriptive term commonly used in patent claims to "avoid a strict numerical boundary to the specified parameter."; e.g., see *Pall Corp.* v. *Micron Seps.,* 66 F.3d 1211, 1217, 36 USPQ2d 1225, 1229 (Fed. Cir. 1995); see, e.g., *Andrew Corp.* v. *Gabriel Elecs. Inc.,* 847 F.2d 819, 821-22, 6 USPQ2d 2010, 2013 (Fed. Cir. 1988) (noting that terms such as "approach each other," "close to," "substantially equal," and "closely approximate" are ubiquitously used in patent claims and that such usages, when serving reasonably to describe the claimed subject matter to those of skill in the field of the invention, and to distinguish the claimed subject matter from the prior art, have been accepted in patent examination and upheld by the courts). In this case, "substantially" avoids the strict 100% nonuniformity boundary.

Indeed, the foregoing sanctioning of such words of approximation, as contemplated in the foregoing, has been established as early as 1939, see *Ex parte Mallory,* 52 USPQ 297, 297 (Pat. Off. Bd. App. 1941) where, for example, the court said "the claims specify that the film is "substantially" eliminated and for the intended purpose, it is believed that the slight portion of the film which may remain is negligible. We are of the view, therefore, that the claims may be regarded as sufficiently accurate." Similarly, In re *Hutchison,* 104 F.2d 829, 42 USPQ 90, 93 (C.C.P.A. 1939) the court said "It is realized that "substantial distance" is a relative and somewhat indefinite term, or phrase, but terms and phrases of this character are not uncommon in patents in cases where, according to the art involved, the meaning can be determined with reasonable clearness."

Hence, for at least the forgoing reason, Applicants submit that it is improper for any examiner to hold as indefinite any claims of the present patent that employ any words of approximation.

Unless defined otherwise, all technical and scientific terms used herein have the same meanings as commonly understood by one of ordinary skill in the art to which this invention belongs. Preferred methods, techniques, devices, and materials are described, although any methods, techniques, devices, or materials similar or equivalent to those described herein may be used in the practice or testing of the present invention. Structures described herein are to be understood also to refer to functional equivalents of such structures. The present invention will be described in detail below with reference to embodiments thereof as illustrated in the accompanying drawings.

References to a "device," an "apparatus," a "system," etc., in the preamble of a claim should be construed broadly to mean "any structure meeting the claim terms" exempt for any specific structure(s)/type(s) that has/(have) been explicitly disavowed or excluded or admitted/implied as prior art in the present specification or incapable of enabling an object/aspect/goal of the invention. Furthermore, where the present specification discloses an object, aspect, function, goal, result, or advantage of the invention that a specific prior art structure and/or method step is similarly capable of performing yet in a very different way, the present invention disclosure is intended to and shall also implicitly include and cover additional corresponding alternative embodiments that are otherwise identical to that explicitly disclosed except that they exclude such prior art structure(s)/step(s), and shall accordingly be deemed as providing sufficient disclosure to support a corresponding negative limitation in a claim claiming such alternative embodiment(s), which exclude such very different prior art structure(s)/step(s) way(s).

From reading the present disclosure, other variations and modifications will be apparent to persons skilled in the art. Such variations and modifications may involve equivalent and other features which are already known in the art, and which may be used instead of or in addition to features already described herein.

Although Claims have been formulated in this Application to particular combinations of features, it should be understood that the scope of the disclosure of the present invention also includes any novel feature or any novel combination of features disclosed herein either explicitly or implicitly or any generalization thereof, whether or not it relates to the same invention as presently claimed in any Claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable subcombination. The Applicants hereby give notice that new Claims may be formulated to such features and/or combinations of such features during the prosecution of the present Application or of any further Application derived therefrom.

References to "one embodiment," "an embodiment," "example embodiment," "various embodiments," "some embodiments," "embodiments of the invention," etc., may indicate that the embodiment(s) of the invention so described may include a particular feature, structure, or characteristic, but not every possible embodiment of the invention necessarily includes the particular feature, structure, or characteristic. Further, repeated use of the phrase "in one embodiment," or "in an exemplary embodiment," "an embodiment," do not necessarily refer to the same embodiment, although they may. Moreover, any use of phrases like "embodiments" in connection with "the invention" are never meant to characterize that all embodiments of the invention must include the particular feature, structure, or characteristic, and should instead be understood to mean "at least some embodiments of the invention" includes the stated particular feature, structure, or characteristic.

References to "user", or any similar term, as used herein, may mean a human or non-human user thereof. Moreover, "user", or any similar term, as used herein, unless expressly stipulated otherwise, is contemplated to mean users at any stage of the usage process, to include, without limitation, direct user(s), intermediate user(s), indirect user(s), and end user(s). The meaning of "user", or any similar term, as used herein, should not be otherwise inferred or induced by any pattern(s) of description, embodiments, examples, or referenced prior-art that may (or may not) be provided in the present patent.

References to "end user", or any similar term, as used herein, are generally intended to mean late stage user(s) as opposed to early stage user(s). Hence, it is contemplated that there may be a multiplicity of different types of "end user" near the end stage of the usage process. Where applicable, especially with respect to distribution channels of embodiments of the invention comprising consumed retail products/services thereof (as opposed to sellers/vendors or Original Equipment Manufacturers), examples of an "end user" may include, without limitation, a "consumer", "buyer", "customer", "purchaser", "shopper", "enjoyer", "viewer", or individual person or non-human thing benefiting in any way, directly or indirectly, from use of or interaction, with some aspect of the present invention.

In some situations, some embodiments of the present invention may provide beneficial usage to more than one stage or type of usage in the foregoing usage process. In such cases where multiple embodiments targeting various stages of the usage process are described, references to "end user", or any similar term, as used therein, are generally intended to not include the user that is the furthest removed, in the foregoing usage process, from the final user therein of an embodiment of the present invention.

Where applicable, especially with respect to retail distribution channels of embodiments of the invention, intermediate user(s) may include, without limitation, any individual person or non-human thing benefiting in any way, directly or indirectly, from use of, or interaction with, some aspect of the present invention with respect to selling, vending, Original Equipment Manufacturing, marketing, merchandising, distributing, service providing, and the like thereof.

References to "person", "individual", "human", "a party", "animal", "creature", or any similar term, as used herein, even if the context or particular embodiment implies living user, maker, or participant, it should be understood that such characterizations are sole by way of example, and not limitation, in that it is contemplated that any such usage, making, or participation by a living entity in connection with making, using, and/or participating, in any way, with embodiments of the present invention may be substituted by such similar performed by a suitably configured non-living entity, to include, without limitation, automated machines, robots, humanoids, computational systems, information processing systems, artificially intelligent systems, and the like. It is further contemplated that those skilled in the art will readily recognize the practical situations where such living makers, users, and/or participants with embodiments of the present invention may be in whole, or in part, replaced with such non-living makers, users, and/or participants with embodiments of the present invention. Likewise, when those skilled in the art identify such practical situations where such living makers, users, and/or participants with embodiments of the present invention may be in whole, or in part, replaced with such non-living makers, it will be readily apparent in light of the teachings of the present invention how to adapt the described embodiments to be suitable for such non-living makers, users, and/or participants with embodiments of the present invention. Thus, the invention is thus to also cover all such modifications, equivalents, and alternatives falling within the spirit and scope of such adaptations and modifications, at least in part, for such non-living entities.

Headings provided herein are for convenience and are not to be taken as limiting the disclosure in any way.

The enumerated listing of items does not imply that any or all of the items are mutually exclusive, unless expressly specified otherwise.

It is understood that the use of specific component, device and/or parameter names are for example only and not meant to imply any limitations on the invention. The invention may thus be implemented with different nomenclature/terminology utilized to describe the mechanisms/units/structures/components/devices/parameters herein, without limitation. Each term utilized herein is to be given its broadest interpretation given the context in which that term is utilized.

Terminology. The following paragraphs provide definitions and/or context for terms found in this disclosure (including the appended claims):

"Comprising." This term is open-ended. As used in the appended claims, this term does not foreclose additional structure or steps. Consider a claim that recites: "A memory controller comprising a system cache . . . ." Such a claim does not foreclose the memory controller from including additional components (e.g., a memory channel unit, a switch).

"Configured To." Various units, circuits, or other components may be described or claimed as "configured to" perform a task or tasks. In such contexts, "configured to" or "operable for" is used to connote structure by indicating that the mechanisms/units/circuits/components include structure (e.g., circuitry and/or mechanisms) that performs the task or tasks during operation. As such, the mechanisms/unit/circuit/component can be said to be configured to (or be operable) for perform(ing) the task even when the specified mechanisms/unit/circuit/component is not currently operational (e.g., is not on). The mechanisms/units/circuits/components used with the "configured to" or "operable for" language include hardware—for example, mechanisms, structures, electronics, circuits, memory storing program instructions executable to implement the operation, etc. Reciting that a mechanism/unit/circuit/component is "configured to" or "operable for" perform(ing) one or more tasks are expressly intended not to invoke 35 U.S.C. .sctn.112, sixth paragraph, for that mechanism/unit/circuit/component. "Configured to" may also include adapting a manufacturing process to fabricate devices or components that are adapted to implement or perform one or more tasks "Based On." As used herein, this term is used to describe one or more factors that affect a determination. This term does not foreclose additional factors that may affect a determination. That is, a determination may be solely based on those factors or based, at least in part, on those factors. Consider the phrase "determine A based on B." While B may be a factor that affects the determination of A, such a phrase does not foreclose the determination of A from also being based on C. In other instances, A may be determined based solely on B.

The terms "a", "an" and "the" mean "one or more", unless expressly specified otherwise.

Unless otherwise indicated, all numbers expressing conditions, concentrations, dimensions, and so forth used in the specification and claims are to be understood as being modified in all instances by the term "about." Accordingly, unless indicated to the contrary, the numerical parameters set forth in the following specification and attached claims are approximations that may vary depending at least upon a specific analytical technique.

The term "comprising," which is synonymous with "including," "containing," or "characterized by" is inclusive or open-ended and does not exclude additional, unrecited elements or method steps. "Comprising" is a term of art used in claim language which means that the named claim elements are essential, but other claim elements may be added and still form a construct within the scope of the claim.

As used herein, the phase "consisting of" excludes any element, step, or ingredient not specified in the claim. When the phrase "consists of" (or variations thereof) appears in a clause of the body of a claim, rather than immediately following the preamble, it limits only the element set forth in that clause; other elements are not excluded from the claim as a whole. As used herein, the phase "consisting essentially of" and "consisting of" limits the scope of a claim to the specified elements or method steps, plus those that do not materially affect the basis and novel characteristic(s) of the claimed subject matter (see *Norian Corp.* v *Stryker Corp.*, 363 F.3d 1321, 1331-32, 70 USPQ2d 1508, Fed. Cir. 2004). Moreover, for any claim of the present invention which claims an embodiment "consisting essentially of" or "consisting of" a certain set of elements of any herein described embodiment it shall be understood as obvious by those skilled in the art that the present invention also covers all possible varying scope variants of any described embodiment(s) that are each exclusively (i.e., "consisting essentially of") functional subsets or functional combination thereof such that each of these plurality of exclusive varying scope variants each consists essentially of any functional subset(s) and/or functional combination(s) of any set of elements of any described embodiment(s) to the exclusion of any others not set forth therein. That is, it is contemplated that it will be obvious to those skilled how to create a multiplicity of alternate embodiments of the present invention that simply consisting essentially of a certain functional combination of elements of any described embodiment(s) to the exclusion of any others not set forth therein, and the invention thus covers all such exclusive embodiments as if they were each described herein.

With respect to the terms "comprising," "consisting of," and "consisting essentially of," where one of these three terms is used herein, the presently disclosed and claimed subject matter may include the use of either of the other two terms. Thus in some embodiments not otherwise explicitly recited, any instance of "comprising" may be replaced by "consisting of" or, alternatively, by "consisting essentially of", and thus, for the purposes of claim support and construction for "consisting of" format claims, such replacements operate to create yet other alternative embodiments "consisting essentially of" only the elements recited in the original "comprising" embodiment to the exclusion of all other elements.

Devices or system modules that are in at least general communication with each other need not be in continuous communication with each other, unless expressly specified otherwise. In addition, devices or system modules that are in at least general communication with each other may communicate directly or indirectly through one or more intermediaries.

A description of an embodiment with several components in communication with each other does not imply that all such components are required. On the contrary a variety of optional components are described to illustrate the wide variety of possible embodiments of the present invention.

As is well known to those skilled in the art many careful considerations and compromises typically must be made when designing for the optimal manufacture of a commercial implementation any system, and in particular, the embodiments of the present invention. A commercial implementation in accordance with the spirit and teachings of the present invention may configured according to the needs of the particular application, whereby any aspect(s), feature(s), function(s), result(s), component(s), approach(es), or step(s) of the teachings related to any described embodiment of the present invention may be suitably omitted, included, adapted, mixed and matched, or improved and/or optimized by those skilled in the art, using their average skills and known techniques, to achieve the desired implementation that addresses the needs of the particular application.

A "computer" may refer to one or more apparatus and/or one or more systems that are capable of accepting a structured input, processing the structured input according to prescribed rules, and producing results of the processing as output. Examples of a computer may include: a computer; a stationary and/or portable computer; a computer having a single processor, multiple processors, or multi-core processors, which may operate in parallel and/or not in parallel; a general purpose computer; a supercomputer; a mainframe; a super mini-computer; a mini-computer; a workstation; a micro-computer; a server; a client; an interactive television; a web appliance; a telecommunications device with internet access; a hybrid combination of a computer and an interactive television; a portable computer; a tablet personal computer (PC); a personal digital assistant (PDA); a portable telephone; application-specific hardware to emulate a computer and/or software, such as, for example, a digital signal processor (DSP), a field-programmable gate array (FPGA), an application specific integrated circuit (ASIC), an application specific instruction-set processor (ASIP), a chip, chips, a system on a chip, or a chip set; a data acquisition device; an optical computer; a quantum computer; a biological computer; and generally, an apparatus that may accept data, process data according to one or more stored software programs, generate results, and typically include input, output, storage, arithmetic, logic, and control units.

Those of skill in the art will appreciate that where appropriate, some embodiments of the disclosure may be practiced in network computing environments with many types of computer system configurations, including personal computers, hand-held devices, multi-processor systems, microprocessor-based or programmable consumer electronics, network PCs, minicomputers, mainframe computers, and the like. Where appropriate, embodiments may also be practiced in distributed computing environments where tasks are performed by local and remote processing devices that are linked (either by hardwired links, wireless links, or by a combination thereof) through a communications network. In a distributed computing environment, program modules may be located in both local and remote memory storage devices.

"Software" may refer to prescribed rules to operate a computer. Examples of software may include: code segments in one or more computer-readable languages; graphical and or/textual instructions; applets; pre-compiled code; interpreted code; compiled code; and computer programs.

The example embodiments described herein can be implemented in an operating environment comprising computer-executable instructions (e.g., software) installed on a computer, in hardware, or in a combination of software and hardware. The computer-executable instructions can be written in a computer programming language or can be embodied in firmware logic. If written in a programming language conforming to a recognized standard, such instructions can be executed on a variety of hardware platforms and for interfaces to a variety of operating systems. Although not limited thereto, computer software program code for carrying out operations for aspects of the present invention can be written in any combination of one or more suitable programming languages, including an object oriented programming languages and/or conventional procedural programming languages, and/or programming languages such as, for example, Hypertext Markup Language (HTML), Dynamic HTML, Extensible Markup Language (XML), Extensible Stylesheet Language (XSL), Document Style Semantics and Specification Language (DSSSL), Cascading Style Sheets (CSS), Synchronized Multimedia Integration Language (SMIL), Wireless Markup Language (WML), Java™, Jini™, C, C++, Smalltalk, Perl, UNIX Shell, Visual Basic or Visual Basic Script, Virtual Reality Markup Language (VRML), ColdFusion™ or other compilers, assemblers, interpreters or other computer languages or platforms.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

A network is a collection of links and nodes (e.g., multiple computers and/or other devices connected together) arranged so that information may be passed from one part of the network to another over multiple links and through various nodes. Examples of networks include the Internet, the public switched telephone network, the global Telex network, computer networks (e.g., an intranet, an extranet, a local-area network, or a wide-area network), wired networks, and wireless networks.

The Internet is a worldwide network of computers and computer networks arranged to allow the easy and robust exchange of information between computer users. Hundreds of millions of people around the world have access to computers connected to the Internet via Internet Service Providers (ISPs). Content providers (e.g., website owners or operators) place multimedia information (e.g., text, graphics, audio, video, animation, and other forms of data) at specific locations on the Internet referred to as webpages. Websites comprise a collection of connected, or otherwise related, webpages. The combination of all the websites and their corresponding webpages on the Internet is generally known as the World Wide Web (WWW) or simply the Web.

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

The flowchart and block diagrams in the figures illustrate the architecture, functionality, and operation of possible implementations of systems, methods and computer program products according to various embodiments. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

Further, although process steps, method steps, algorithms or the like may be described in a sequential order, such processes, methods and algorithms may be configured to work in alternate orders. In other words, any sequence or order of steps that may be described does not necessarily indicate a requirement that the steps be performed in that order. The steps of processes described herein may be performed in any order practical. Further, some steps may be performed simultaneously.

It will be readily apparent that the various methods and algorithms described herein may be implemented by, e.g., appropriately programmed general purpose computers and computing devices. Typically a processor (e.g., a microprocessor) will receive instructions from a memory or like device, and execute those instructions, thereby performing a process defined by those instructions. Further, programs that implement such methods and algorithms may be stored and transmitted using a variety of known media.

When a single device or article is described herein, it will be readily apparent that more than one device/article (whether or not they cooperate) may be used in place of a single device/article. Similarly, where more than one device or article is described herein (whether or not they cooperate), it will be readily apparent that a single device/article may be used in place of the more than one device or article.

The functionality and/or the features of a device may be alternatively embodied by one or more other devices which are not explicitly described as having such functionality/features. Thus, other embodiments of the present invention need not include the device itself.

The term "computer-readable medium" as used herein refers to any medium that participates in providing data (e.g., instructions) which may be read by a computer, a processor or a like device. Such a medium may take many forms, including but not limited to, non-volatile media, volatile media, and transmission media. Non-volatile media include, for example, optical or magnetic disks and other persistent memory. Volatile media include dynamic random access memory (DRAM), which typically constitutes the main memory. Transmission media include coaxial cables, copper wire and fiber optics, including the wires that comprise a system bus coupled to the processor. Transmission media may include or convey acoustic waves, light waves and electromagnetic emissions, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, an EPROM, a FLASH-EEPROM, removable media, flash memory, a "memory stick", any other memory chip or cartridge, a carrier wave as described hereinafter, or any other medium from which a computer can read.

Various forms of computer readable media may be involved in carrying sequences of instructions to a processor. For example, sequences of instruction (i) may be delivered from RAM to a processor, (ii) may be carried over a wireless transmission medium, and/or (iii) may be formatted according to numerous formats, standards or protocols, such as Bluetooth, TDMA, CDMA, 3G.

Where databases are described, it will be understood by one of ordinary skill in the art that (i) alternative database structures to those described may be readily employed, (ii) other memory structures besides databases may be readily employed. Any schematic illustrations and accompanying descriptions of any sample databases presented herein are exemplary arrangements for stored representations of information. Any number of other arrangements may be employed besides those suggested by the tables shown. Similarly, any illustrated entries of the databases represent exemplary information only; those skilled in the art will understand that the number and content of the entries can be different from those illustrated herein. Further, despite any depiction of the databases as tables, an object-based model could be used to store and manipulate the data types of the present invention and likewise, object methods or behaviors can be used to implement the processes of the present invention.

A "computer system" may refer to a system having one or more computers, where each computer may include a computer-readable medium embodying software to operate the computer or one or more of its components. Examples of a computer system may include: a distributed computer system for processing information via computer systems linked by a network; two or more computer systems connected together via a network for transmitting and/or receiving information between the computer systems; a computer system including two or more processors within a single computer; and one or more apparatuses and/or one or more systems that may accept data, may process data in accordance with one or more stored software programs, may generate results, and typically may include input, output, storage, arithmetic, logic, and control units.

A "network" may refer to a number of computers and associated devices that may be connected by communication facilities. A network may involve permanent connections such as cables or temporary connections such as those made through telephone or other communication links. A network may further include hard-wired connections (e.g., coaxial cable, twisted pair, optical fiber, waveguides, etc.) and/or wireless connections (e.g., radio frequency waveforms, free-space optical waveforms, acoustic waveforms, etc.). Examples of a network may include: an internet, such as the Internet; an intranet; a local area network (LAN); a wide area network (WAN); and a combination of networks, such as an internet and an intranet.

As used herein, the "client-side" application should be broadly construed to refer to an application, a page associated with that application, or some other resource or function invoked by a client-side request to the application. A "browser" as used herein is not intended to refer to any specific browser (e.g., Internet Explorer, Safari, FireFox, or the like), but should be broadly construed to refer to any client-side rendering engine that can access and display Internet-accessible resources. A "rich" client typically refers to a non-HTTP based client-side application, such as an SSH or CFIS client. Further, while typically the client-server interactions occur using HTTP, this is not a limitation either. The client server interaction may be formatted to conform to the Simple Object Access Protocol (SOAP) and travel over HTTP (over the public Internet), FTP, or any other reliable transport mechanism (such as IBM® MQSeries® technologies and CORBA, for transport over an enterprise intranet) may be used. Any application or functionality described herein may be implemented as native code, by providing hooks into another application, by facilitating use of the mechanism as a plug-in, by linking to the mechanism, and the like.

Exemplary networks may operate with any of a number of protocols, such as Internet protocol (IP), asynchronous transfer mode (ATM), and/or synchronous optical network (SONET), user datagram protocol (UDP), IEEE 802.x, etc.

Embodiments of the present invention may include apparatuses for performing the operations disclosed herein. An apparatus may be specially constructed for the desired purposes, or it may comprise a general-purpose device selectively activated or reconfigured by a program stored in the device.

Embodiments of the invention may also be implemented in one or a combination of hardware, firmware, and software. They may be implemented as instructions stored on a machine-readable medium, which may be read and executed by a computing platform to perform the operations described herein.

More specifically, as will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

In the following description and claims, the terms "computer program medium" and "computer readable medium" may be used to generally refer to media such as, but not limited to, removable storage drives, a hard disk installed in hard disk drive, and the like. These computer program products may provide software to a computer system. Embodiments of the invention may be directed to such computer program products.

An algorithm is here, and generally, considered to be a self-consistent sequence of acts or operations leading to a desired result. These include physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers or the like. It should be understood, however, that all of these and similar terms are to be associated with the appropriate physical quantities and are merely convenient labels applied to these quantities.

Unless specifically stated otherwise, and as may be apparent from the following description and claims, it should be appreciated that throughout the specification descriptions utilizing terms such as "processing," "computing," "calculating," "determining," or the like, refer to the action and/or processes of a computer or computing system, or similar electronic computing device, that manipulate and/or transform data represented as physical, such as electronic, quantities within the computing system's registers and/or memories into other data similarly represented as physical quantities within the computing system's memories, registers or other such information storage, transmission or display devices.

Additionally, the phrase "configured to" or "operable for" can include generic structure (e.g., generic circuitry) that is manipulated by software and/or firmware (e.g., an FPGA or a general-purpose processor executing software) to operate in a manner that is capable of performing the task(s) at issue. "Configured to" may also include adapting a manufacturing process (e.g., a semiconductor fabrication facility) to fabricate devices (e.g., integrated circuits) that are adapted to implement or perform one or more tasks.

In a similar manner, the term "processor" may refer to any device or portion of a device that processes electronic data from registers and/or memory to transform that electronic data into other electronic data that may be stored in registers and/or memory. A "computing platform" may comprise one or more processors.

Embodiments within the scope of the present disclosure may also include tangible and/or non-transitory computer-readable storage media for carrying or having computer-executable instructions or data structures stored thereon. Such non-transitory computer-readable storage media can be any available media that can be accessed by a general purpose or special purpose computer, including the functional design of any special purpose processor as discussed above. By way of example, and not limitation, such non-transitory computer-readable media can include RAM, ROM, EEPROM, CD-ROM or other optical disk storage, magnetic disk storage or other magnetic storage devices, or any other medium which can be used to carry or store desired program code means in the form of computer-executable instructions, data structures, or processor chip design. When information is transferred or provided over a network or another communications connection (either hardwired, wireless, or combination thereof) to a computer, the computer properly views the connection as a computer-readable medium. Thus, any such connection is properly termed a computer-readable medium. Combinations of the above should also be included within the scope of the computer-readable media.

While a non-transitory computer readable medium includes, but is not limited to, a hard drive, compact disc, flash memory, volatile memory, random access memory, magnetic memory, optical memory, semiconductor based memory, phase change memory, optical memory, periodically refreshed memory, and the like; the non-transitory computer readable medium, however, does not include a pure transitory signal per se; i.e., where the medium itself is transitory.

Many embodiments, and variations thereof, may provide for machine learning methods and means for learning from, but not limited to, tags, barcodes, human entering IDs, QR codes, radio-frequency identification (RFID)s, etc. In some embodiments, a machine learning system may identify an item associated with a database. The machine learning system may classify the item by obtaining an image or images from, without limitation, a camera. The system may classify the item to match a database by, but not limited to, ID, barcode or QR code etc.

Some embodiments, may be implemented in a component such as, but not limited to, a smart device with a scanner and a camera capability. Through a network connection, the smart device may send barcode and associated images to a cloud computing system. The cloud computing system may train a neural network or machine learning database. In some embodiments, the smart device may be incorporated in a robotic like device. Some embodiments may be implemented for recognizing an ID of a customer.

In some embodiments, a POS system may include, without limitation, a scanner component, which may scan, but not limited to, barcodes, QR codes, RFIDs, IDs, etc., a camera component, which may capture one or more images of objects, and a computing component with a prediction algorithm to classify the object. In some embodiments, the POS system may include one or more database for, but not limited to, a point of sale, a point of return or customer order, aisle number and map of items, inventory management, customer relationship management (CRM), financials and warehousing, etc. In some embodiments, the POS system may include a training database in a server system for training a neural network or artificial intelligence algorithm. In some embodiments, the POS system may include a database for storing a POS database for such as, but not limited to, calculating total price, making a payment in exchange for goods, issuing a receipt for the transaction, inventory management, CRM, financials and warehousing, etc. In some embodiments, the POS system may include an image database for, but not limited to, supervised training. In some embodiments, the POS system may include a database for storing aisle number and floor map of items. In some embodiments, the POS system may function to display the aisle number and floor map of searched items. In some embodiments, the POS system may function to compare an aisle number and floor maps of an object to a database to see whether it is misplaced or not.

Some embodiments may be incorporated with a surveillance system. In some embodiments, the surveillance system may incorporate supervised learning. In some embodiments, the surveillance system may incorporate unsupervised learning. In some embodiments, the surveillance system may include, but not limited to: one or more devices that may include, but not limited to, a camera unit for capturing images, and a computing unit for capturing images/videos to identify names of the people; a server system for training on images/video and uploading neural weights to the one or more devices; and a network for linking the devices and the server system. In some embodiments, the surveillance system may find a similarity of a certain signature or image and report the location.

FIG. 1 illustrates a system for providing chuck packing using data a, in accordance with an embodiment of the present invention. In the system 1200 of FIG. 1, data a1-a3 1202-1208 are provided as input to mux0-mux3 1212-1218. Select signals 1222-1228 are provided to each of mux0-mux3. Each of mux0-mux3 1212-1218 provide mask results as outputs, pa0-pa3 1232-1238. As an illustration, 4 elements of a chuck are first arranged into a packed format. For example:

(a0,a1,a2,a3)=(x00, 0, 0, 0) are packed into (pa0,pa1,pa2, pa3)=(x00, 0, 0, 0) and a_mask=(1, 0, 0, 0) and a_mask=4'b0001 are used.

(b0,b1,b2,b3)=(0, x11, 0, 0) are packed into (pb0,pb1, pb2,pb3)=(x11, 0, 0, 0) and b_mask=(0, 1, 0, 0) and b_mask=4'b0010 are used.

(c0,c1,c2,c3)=(0, 0, 0, x23) are packed into (pc0,pc1,pc2, pc3)=(x23, 0, 0, 0) and c_mask=(0, 0, 0, 1) and c_mask=4'b1000 are used.

(d0,d1,d2,d3)=(0, 0, x32, 0) are packed into (pd0,pd1, pd2,pd3)=(x32, 0, 0, 0) and d_mask=(0, 0, 1, 0) and d_mask=4'b0100 are used.

The inputs are: (a0, a1, a2, a3) 1202-1208. The operation logic is: mux0 mux1 mux2 mux3 1212-1218. The outputs are: (pa0, pa1, pa2, pa3) 1232-1238. First, the mask is calculated to represent the current value is zero or non-zero. The mask could also be calculated in the prior pipeline.

The masks are:
a_msk0=(a0 !=0); a_msk1=(a1 !=0); a_msk2=(a2 !=0); a_msk3=(a3 !=0).

Each input element will be 32 bits in this example. The operation logic is:
mux0 inputs=(a0, a1, a2, a3); mux1 inputs=(a1, a2, a3); mux2 inputs=(a2, a3); mux3 inputs=(a3).

sel0=((a_msk0) and 2'b00) or ((!a_msk0 and a_msk1) and 2'b01) or ((!a_msk0 and !a_msk1 and a_msk2) and 2'b10)) or ((!a_msk0 and !a_msk1 and !a_msk2 and a_msk3) and 2'b11);

sel1=((a_msk0 and a_msk1) and 2'b00) or (((a_msk=4'bx101) or (a_msk==4'bx110)) and 2'b01) or (((a_msk=4'b1001) or (a_msk==4'b1100)) and 2'b10);

sel2=((a_msk==4'bx111) and 2'b00) or (((a_msk==4'b1011) or (a_msk0==4'b1110) or (a_msk==4'b1101)) and 2'b01); and sel3=((a_msk==4'b1111) and 2'b00)

Each selector 1222-1228 of the corresponding mux choose one of the its inputs to the output of the its mux. Then, the final result is (pa0,pa1,pa2,pa3) 1232-1238.

If the same logic is applied and the mux inputs are replaced by a mask, where a_msk0 is just a bit of logic that is very small.

Figure 2:
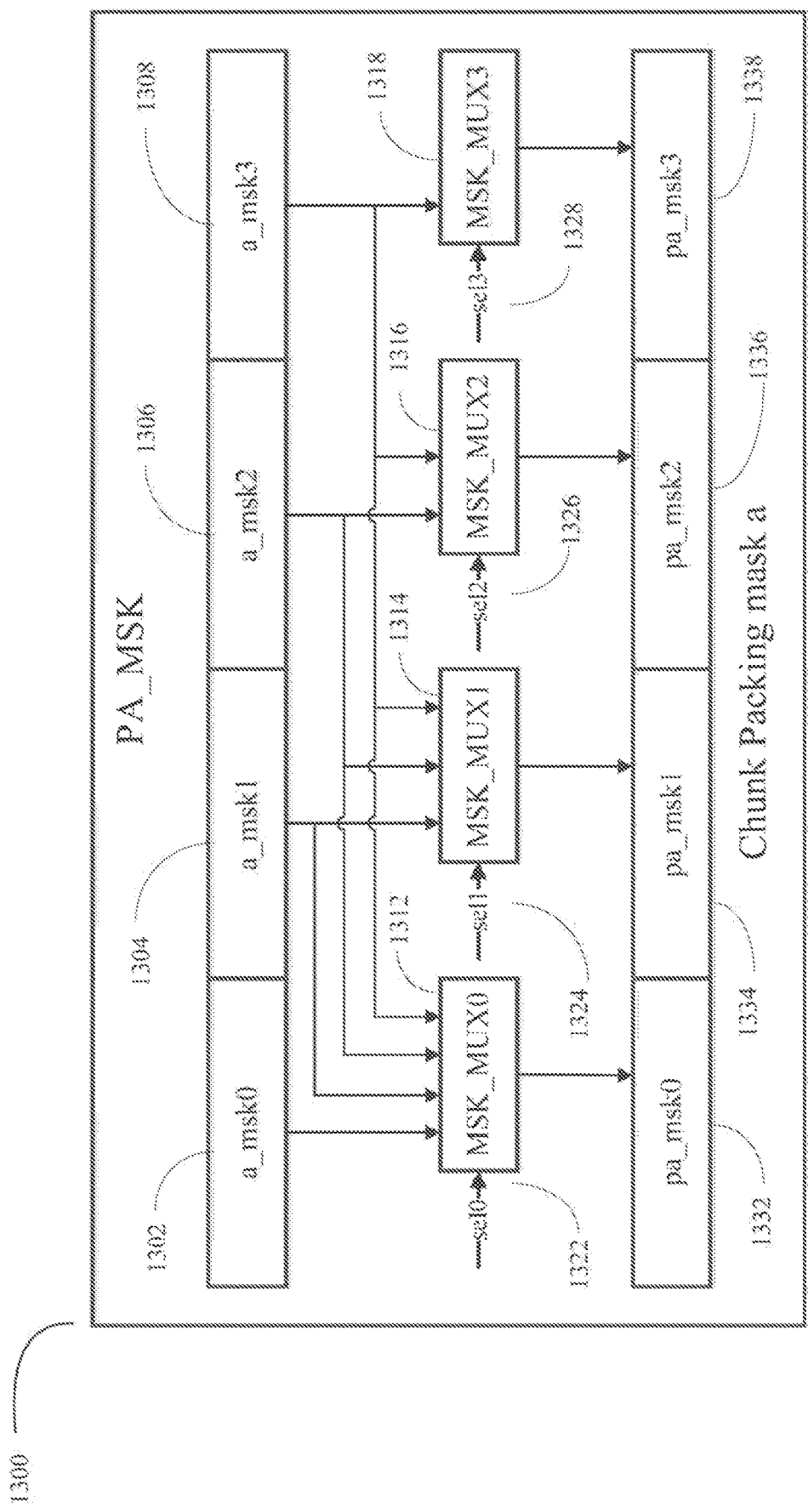
FIG. 2 illustrates chuck packing using mask a, in accordance with an embodiment of the present invention.

FIG. 2 illustrates a system for providing chuck packing using mask a, in accordance with an embodiment of the present invention. In the system 1300 of FIG. 2, masks 1302-1308 are provided as input to mux0-mux3 1312-1318. Select signals 1322-1328 are provided to each of mux0-mux3 1312-1318. Each of mux0-mux3 provide mask results as outputs.

For example:
msk_mux0 inputs=(a_msk0, a_msk1, a_msk2, a_msk3)
msk_mux1 inputs=(a_msk1, a_msk2, a_msk3)
msk_mux2 inputs=(a_msk2, a_msk3)
msk_mux3 inputs=(a_msk3)

The mask result are: (pa_msk0, pa_msk1, pa_msk2, pa_msk3) 1332-1338.

Figure 3:
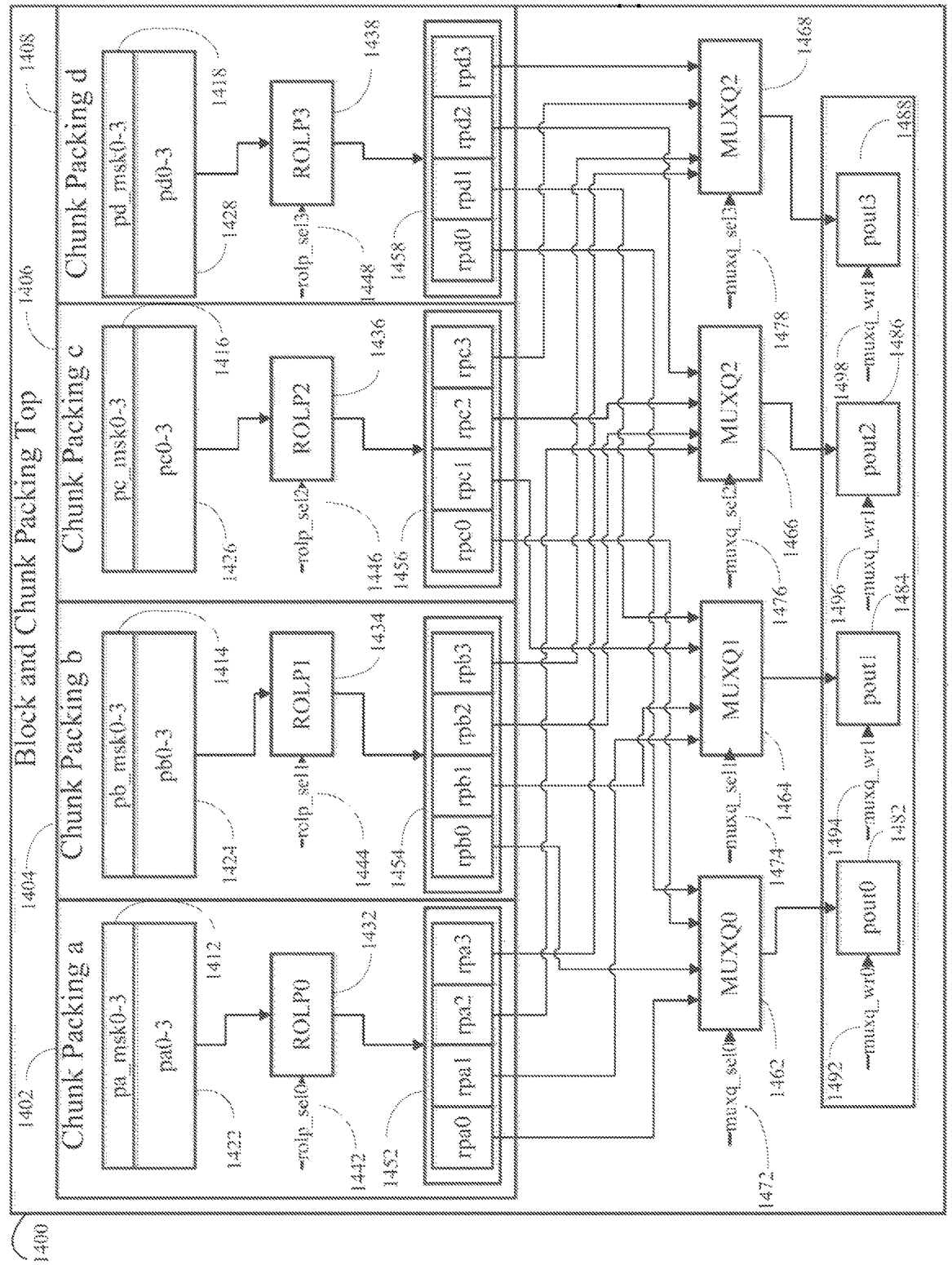
FIG. 3 illustrates block and chunk packing in accordance with an embodiment of the present invention.

Besides generating the outputs pa0-3 and pa_msk0-3, we also need to use the similar logic blocks and algorithms to generate the chunk packing output (pb0,pb1,pb2,pb3), (pc0,pc1,pc2,pc3) and (pd0,pd1,pd2,pd3) and (pb_msk0,pb_msk1,pb_msk2,pb_msk3), (pc_msk0,pc_msk1,pc_msk2,pc_msk3) and (pd_msk0,pd_msk1,pd_msk2,pd_msk3). The next step is packing these 4 small chunks into a packed block. The chunk stage outputs are the block level inputs:

FIG. 3 illustrates a system for providing block and chunk packing in accordance with an embodiment of the present invention. In the system 1400 of FIG. 3, for each chunk packing a-d 1402-1408, inputs pa0-3, pb0-3, pc0-3, pd0-3 1422-1428 are provided based on pa-msk0-3, pb-msk0-3, pc-msk0-3, pd_msk0-3 1412-1418 to the chuck level operations ROLP0-3 1432-1438 and rotation selections signals rolp_sel0-3 1442-1448 are received. The chuck level operations ROLP0-3 1432-1438 provide rotated outputs rpa0-3, rpb0-3, rpc0-3, rpd0-3 1452-1458. MuxQ0-3 1462-1468 provide block level operations using mux select signals muxq_sel0-3 1472-1478. Block level outputs pout0-3 1482-1488 are provided based on mux write selection signals muxq_wr0-3 1492-1498, In FIG. 3, the same logic and algorithm also apply to small 4 elements of b, c, and d. The result of (pb0,pb1,pb2,pb3), (pc0,pc1,pc2,pc3) and (pd0,pd1,pd2,pd3) and (pb_msk0,pb_msk1,pb_msk2,pb_msk3), (pc_msk0, pc_msk1,pc_msk2,pc_msk3) and (pd_msk0,pd_msk1, pd_msk2,pd_msk3) are generated. The next step is packing these 4 small packed of 4 elements into packed 16 elements. The chunk stage outputs are the block level inputs.

Block level operations, muxq0, muxq1, muxq2, muxq3 1462-1468 provide block level outputs: pout0, pout1, pout2, pout3.

The calculation of rotation determined according to:
rolp_sel0=2'b00
rolp_sel1=least significant two bits of sum(pa_msk)
rolp_sel2=least significant two bits of sum(pa_msk, pb_msk)
rolp_sel3=least significant two bits of sum(pa_msk, pb_msk, pc_msk)

The rol function is rol((rpa0, rpa1, rpa2, rpa3), sel). If sel='b00, then the output will be (rpa0, rpa1, rpa2, rpa3), if sel='b01, then the output will be (rpa1, rpa2, rpa3, rpa0), if sel='b10, then the output will be (rpa2, rpa3, rpa0, rpa1), and if sel='b11, then the output will be (rpa3, rpa0, rpa1, rpa2).

The inputs of muxq0 1462 is (rpa0, rpb0, rpc0, rpd0) and the selector will be:

muxq_sel0=((rpa_msk0) and 2'b00) or ((!rpa_msk0 and rpb_msk0) and 2'b01)) or ((!rpa_msk0 and !rpb_msk0 and rpc_msk0) and 2'b10) or ((!rpa_msk0 and !rpb_msk0 and !rpc_msk0 and rpd_msk0) and 2'b11)), with muxq_wr0=rpa_msk0 or rpb_msk0 or rpc_msk0 or rpd_msk0.

muxq_sel1=((rpa_msk1) and 2'b00) or ((!rpa_msk1 and rpb_msk1) and 2'b01)) or ((!rpa_msk1 and !rpb_msk1 and rpc_msk1) and 2'b10) or ((!rpa_msk1 and !rpb_msk1 and !rpc_msk1 and rpd_msk1) and 2'b11)), with muxq_wr1=rpa_msk1 or rpb_msk1 or rpc_msk1 or rpd_msk1.

muxq_sel2=((rpa_msk2) and 2'b00) or ((!rpa_msk2 and rpb_msk2) and 2'b01)) or ((!rpa_msk2 and !rpb_msk2 and rpc_msk2) and 2'b10) or ((!rpa_msk2 and !rpb_msk2 and !rpc_msk2 and rpd_msk2) and 2'b11)), with muxq_wr2=rpa_msk2 or rpb_msk2 or rpc_msk2 or rpd_msk2.

muxq_sel3=((rpa_msk3) and 2'b00) or ((!rpa_msk3 and rpb_msk3) and 2'b01)) or ((!rpa_msk3 and !rpb_msk3 and rpc_msk3) and 2'b10) or ((!rpa_msk3 and !rpb_msk3 and !rpc_msk3 and rpd_msk3) and 2'b11)), with muxq_wr3=rpa_msk3 or rpb_msk3 or rpc_msk3 or rpd_msk3.

Then the result will write to output either to the following pipelines or to registers. The first final packed data current cycle will be (pout0,pout1,pout2,pout3) 1482-1488. After this, the corresponding bits of pa_msk0-3, pb_msk0-3, pc_msk0-3 and pd_msk0-3 1412-1418 are cleared if their corresponding data write to pout.

The first packing logic is repeated and continued until all of the packed data of the 512 bits has no non-zero values. In other words, all the pa_msk, pb_msk, pc_msk and pd_msk 1412-1416 are zeros. In FIG. 3, 128 packed bits are packed and output constantly for each cycle. The mask of (a_msk, b_msk, c_msk, d_msk) are copied to the pipelines or registers. The example above will provide output values: (x00, x11, x23, x32) and mask: ((1,0,0,0),(0,1,0,0),(0,0,0,1),(0,0,1,0))

Figure 4:
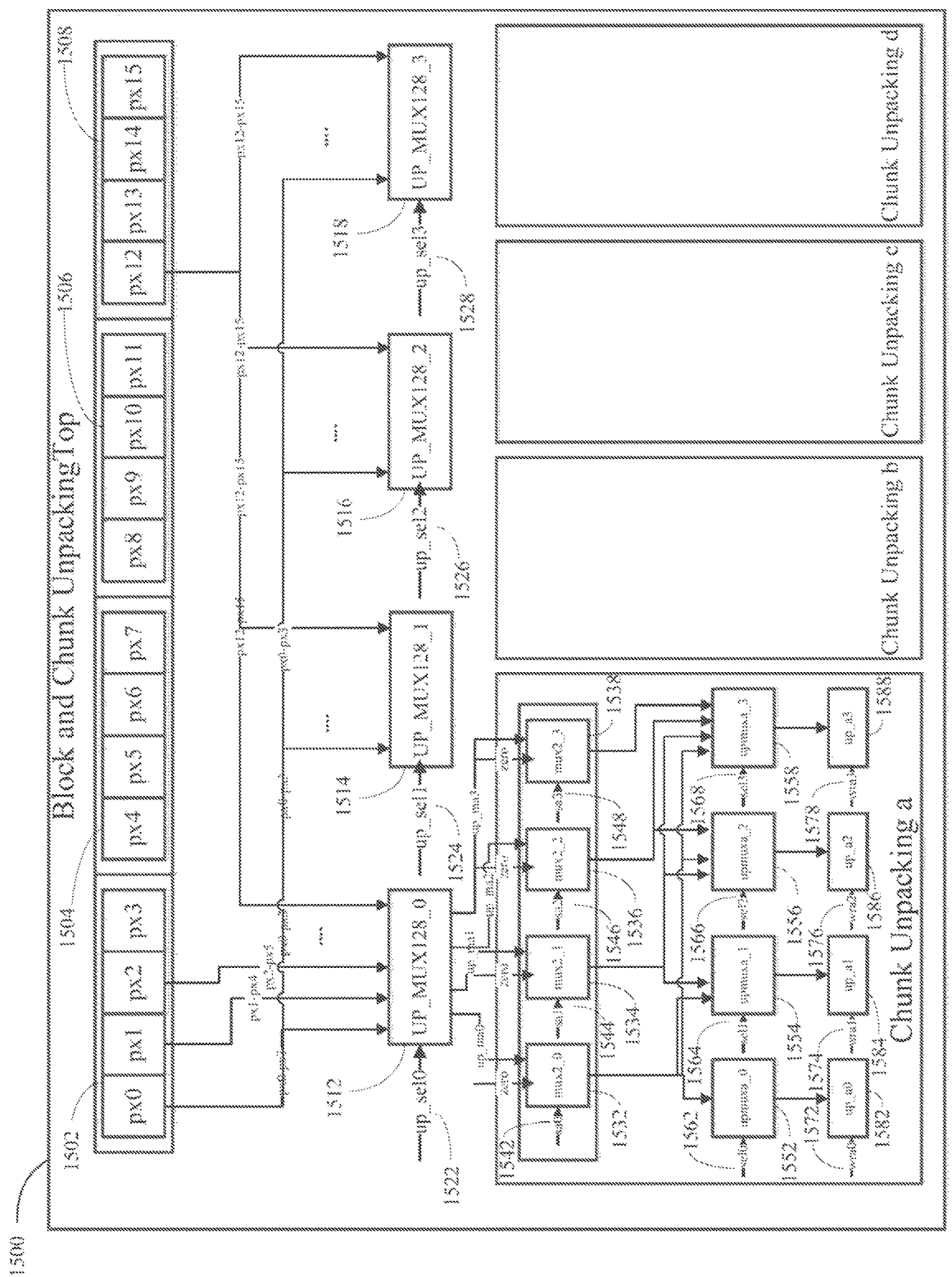
FIG. 4 illustrates the block and chunk unpacking, in accordance with an embodiment of the present invention.

FIG. 4 illustrates a system for providing the block and chunk unpacking, in accordance with an embodiment of the present invention. In the system 1500 of FIG. 4, the block operations for unpacking include providing packed data and masks as input. In FIG. 4, the input packed data is (px0, px1, px2, px3) 1502, (px4, px5, px6, px7) 1504, (px8, px9, px10, px11) 1506, and (px12, px13, px14, px15) 1508. However, the input packed data may be shorter than this. The masks may be msk0, msk1, msk2, msk3, msk4, msk5, msk6, msk7, msk8, msk9, msk10, msk11, msk12, msk13, msk14, msk15. For chunk unpacking a, the inputs are provided into the up_mux128_0 1512 and may be 13 different choices, each with 128 bits. The inputs to up_mux128_0 1512 are px0:3, px1:4, px2:5, px3:6, px4:7, px5:8, px6:9, px7:10, px8:11, px9:12, px10:13, px11:14, px12:15. Similarly, the inputs to up_mux128_1 1514 are px0:3, px1:4, px2:5, px3:6, px4:7, px5:8, px6:9, px7:10, px8:11, px9:12, px10:13, px11:14, px12:15. Continuing the example, the inputs to up_mux128_2 1516 are px0:3, px1:4, px2:5, px3:6, px4:7, px5:8, px6:9, px7:10, px8:11, px9:12, px10:13, px11:14, px12:15 and the inputs to up_mux128_3 1518 are px0:3, px1:4, px2:5, px3:6, px4:7, px5:8, px6:9, px7:10, px8:11, px9:12, px10:13, px11:14, px12:15. Note that px0:3 represents px0, px1, px2, px3.

For operations: up_mux128_0 1512, up_mux128_1 1514, up_mux128_2 1516, up_mux128_3 1518, the selectors are up_sel0 1522, up_sel1 1524, up_sel2 1526, up_sel3 1528. For up_mux128_0 1512, up_sel0=4'b0000. For up_mux128_1 1514, up_sel1=sum(msk0:3). For up_mux128_2 1516, up_sel2=sum(msk0:7) and for up_mux128_3 1518, up_sel3=sum(msk0:11).

The output of current mux will be (up_ma0, up_ma1, up_ma2, up_ma3), (up_mb0, up_mb1, up_mb2, up_mb3), (up_mc0, up_mc1, up_mc2, up_mc3), (up_md0, up_md1, up_md2, up_md3). Next, the small packed chunk are provided to the unpacked position. This step is a chunk operation. Using the following method to chop the data not belonging to this small chunk, len_a represent the length of current chunk. Then, len_a=sum(msk0:3), len_b=sum(msk4:7), len_c=sum(msk8:11), len_d=sum(msk12:15). Accordingly, if (len_a==3'b000), then len_a_msk=(0,0,0,0), if (len_a==3'b001), then len_amsk=(1,0,0,0), if (len_a==3'b010), then len_amsk=(1,1,0,0), if (len_a==3'b011), then len_amsk=(1,1,1,0), and if (len_a==3'b100), then len_a_msk=(1,1,1,1). The selector sa for mux2_0-3 is len_a_msk. Selecting either from up_ma or zero based on len_a_msk, the operations then are mux2_0 1532, mux2_1 1534, mux2_2 1536, mux2_3 1538. Selector signals are sel0-3 1542-1548. For example, the result might be (up_ma0, 0, 0, 0). The same method applies to small packed chunk b, c and d.

The next step is providing the small packed chunk to the unpacked position. This step is a chunk operation. The output of mux2-0-3 are inputs of upmuxa_0-3 1552-1558. Similar operations apply to chunk unpacking b, c, and d. Operations upmuxa_0, upmuxa_1, upmuxa_2, upmuxa_3 receiving selectors sel0 1562, sel1 1564, sel2 1566, sel3 1568, respectively. The selectors are: sel0=2'b00 and (a_msk==4'bxxx1), sel1=(2'b00 and (a_msk==4'bxx10)) or (2'b01 and (a_msk==4'bxx11)), sel2=(2'b00 and (a_msk==4'bx100)) or (2'b01 and ((a_msk==4'bx110) or (a_msk==4'bx101))) or (2'b10 and (a_msk==4'bx111)), and sel3=(2'b00 and (a_msk==4'b1000)) or (2'b01 and ((a_msk==4'b1100) or (a_msk==4'b1010) or (a_msk==4'b1001))) or (2'b10 and ((a_msk==4'b1110) or (a_msk==4'b1101) or (a_msk==4'b1011))) or (2'b11 and (a_msk==4'b1111)).

Based on the mask value, the output is written to the register; otherwise the register is cleared. The write selectors wra0-3 1572-1578 are wra0=a_msk0, wra1=a_msk1, wra2=a_msk2, and wra3=a_msk3. The unpacked output will be (up_a0 1582, up_a1 1584, up_a2 1586, up_a3 1588). The write output of the mux is to the next pipeline or registers. The same method applies to small chunk of b, c and d. Then, the whole data of this packed block is unpacked. The output of b, c, d will be (up_b0, up_b1, up_b2, up_b3), (up_c0, up_c1, up_c2, up_c3), (up_d0, up_d1, up_d2, up_d3). Nevertheless, those skilled in the art will recognize that that block, chunk and element size can be any size. The data is divided into block and chunk size. The hierarchical two levels is used to swizzle the data and pack and unpack the data based on the bit mask zero and non-zero. This provides a good solution for multi-bank memory like SRAM, DRAM, MRAM or any other kind of memory.

Figure 5:
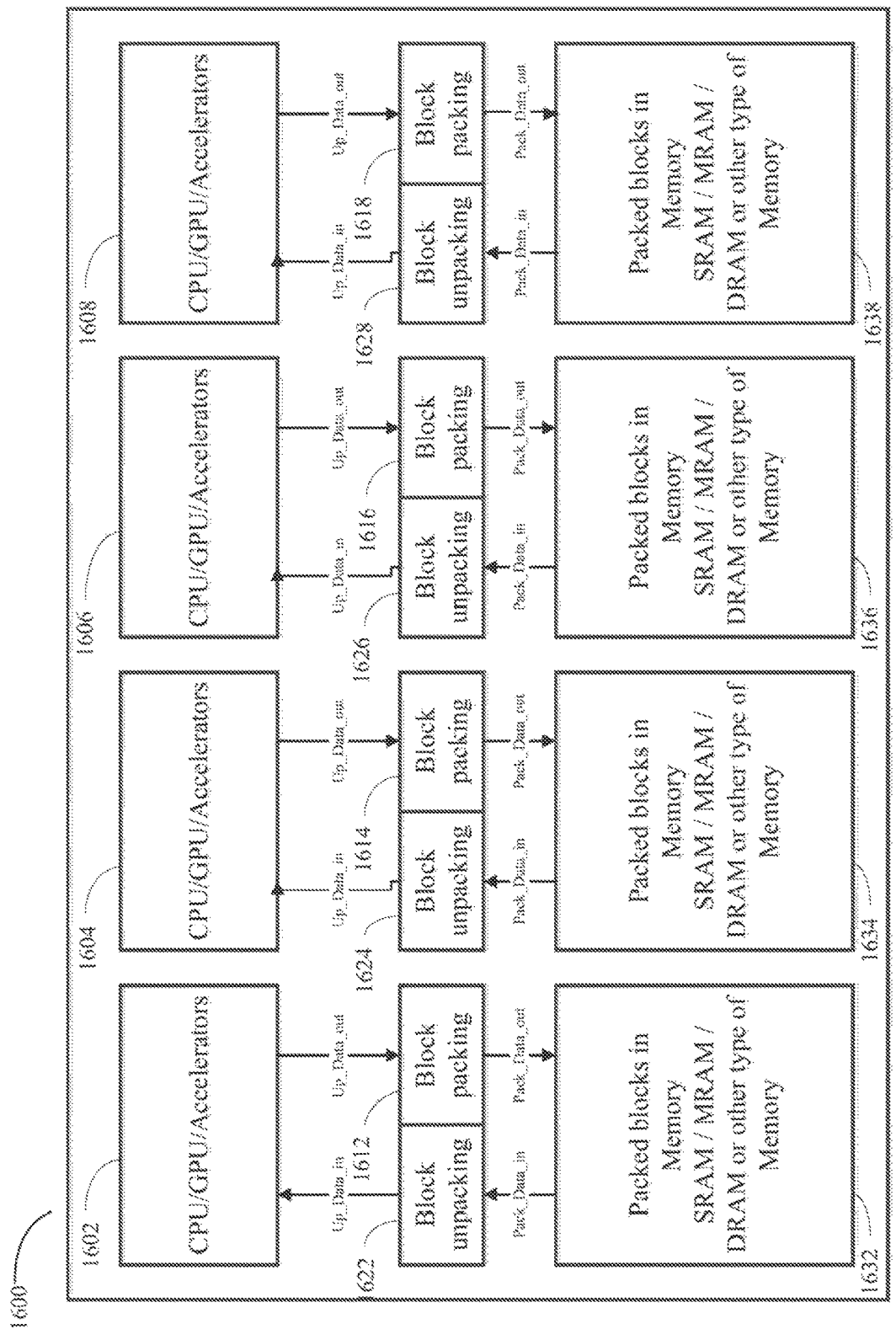
FIG. 5 illustrates the CPU/GPU and accelerator, in accordance with an embodiment of the present invention.

FIG. 5 illustrates a system that includes the CPU/GPU and accelerator, in accordance with an embodiment of the present invention. In the system 1600 of FIG. 5, the CPU/GPU and accelerator 1602-1608 may operate without knowing there is any bit-mask packing or not. If accelerator can support operation on packing data, then the "unpacking logic" may be bypassed. For certain type of applications, sparsity on the data may not be need, and the packing logic 1612-1618 and unpacking logic 1622-1628 may be bypassed. The packed blocks are stored in memory 1632-1638

Figure 6:
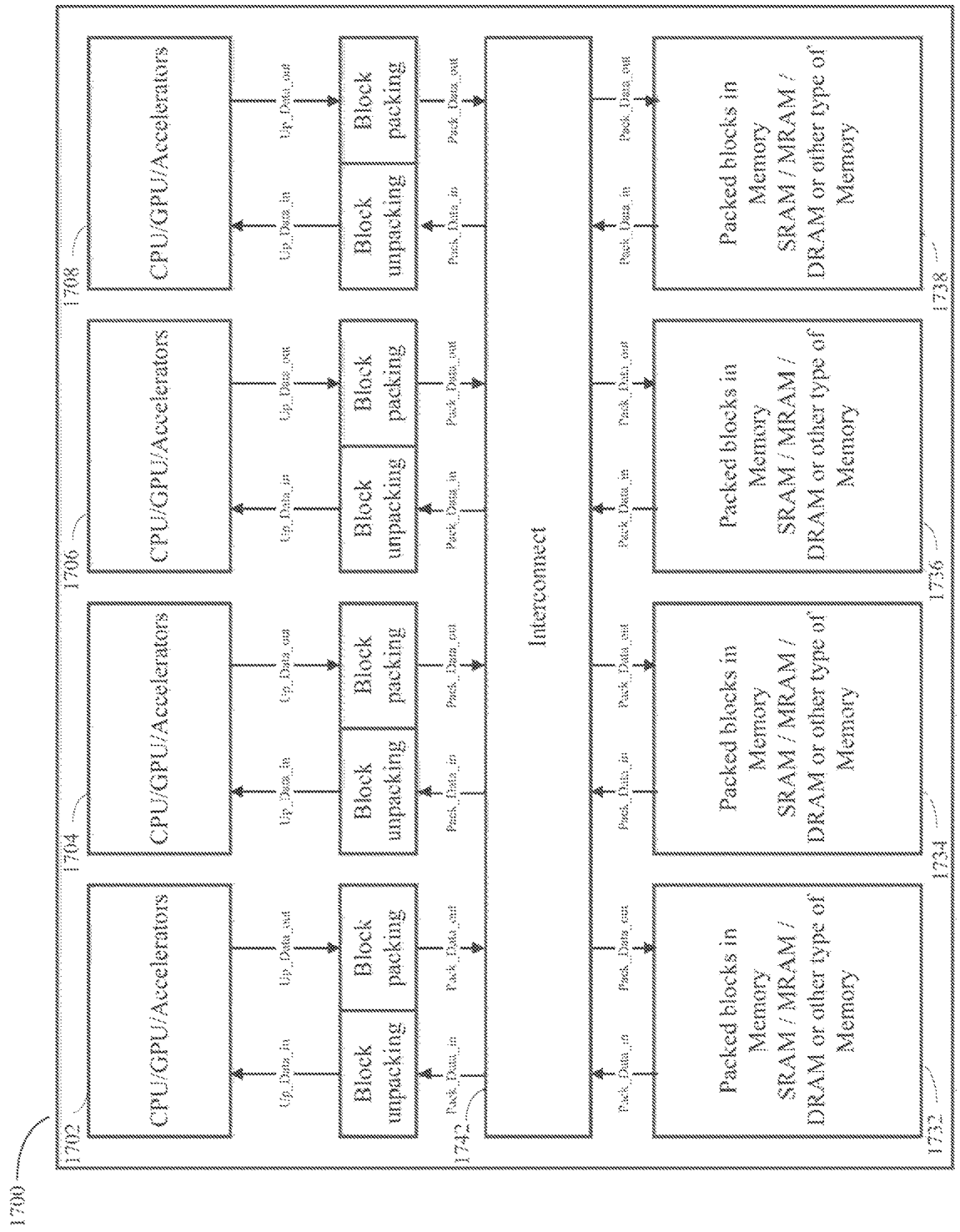
FIG. 6 illustrates data sharing between different banks of memory, in accordance with an embodiment of the present invention.

FIG. 6 illustrates a system for providing data sharing between different banks of memory, in accordance with an embodiment of the present invention. In the system 1700 of FIG. 6, for data sharing between different bank of memory 1732-1738 on CPU/GPU and accelerators 1702-1708, the interconnect 1742 is used to read/write different banks of memory 1732-1738.

Figure 7:
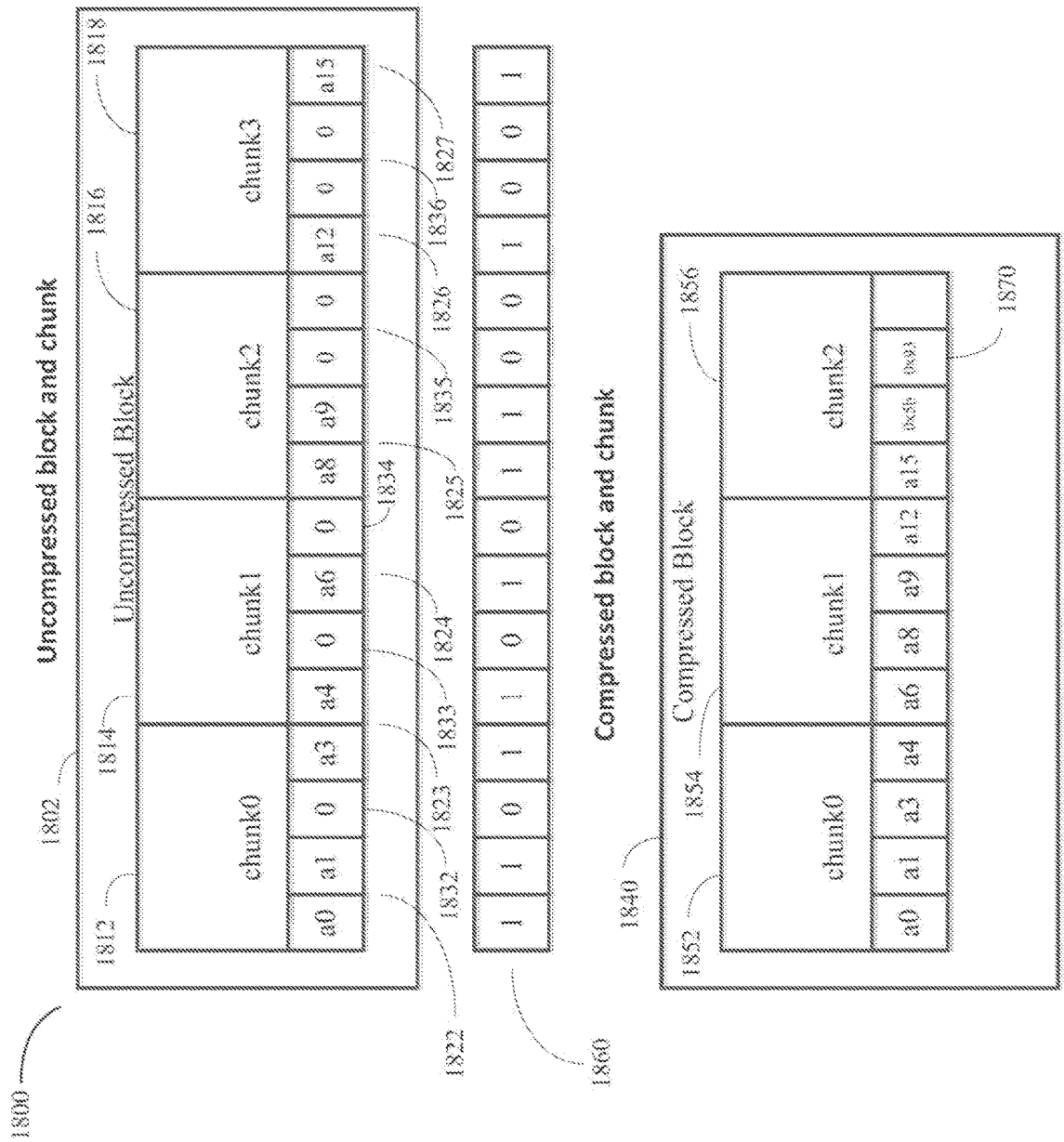
FIG. 7 illustrates uncompressed blocks with 4 chucks, in accordance with an embodiment of the present invention.

FIG. 7 illustrates uncompressed and compressed blocks with 4 chucks, in accordance with an embodiment of the present invention. In the uncompressed blocks and compressed blocks 1800 shown in FIG. 7, each chuck has 4 elements.

Figure 8:
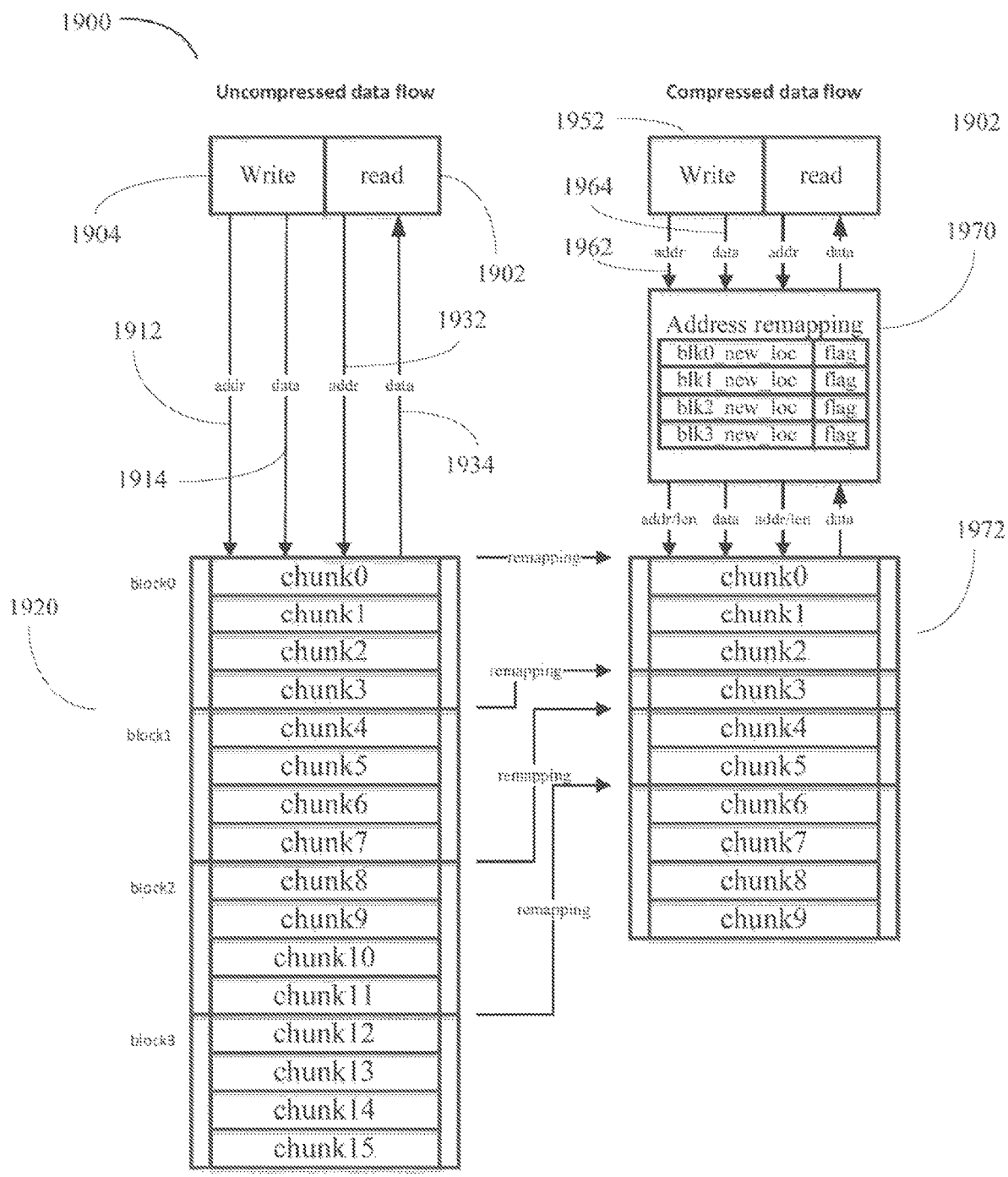
FIG. 8 illustrates uncompressed and compressed data flow, in accordance with an embodiment of the present invention.

Uncompressed block 1802 includes chunk0-3 1812-1818. FIG. 7 shows data elements a0-a1 1822, a3-a4 1823, a6 1824, a8-a9 1825, a12 1826, and a15 1827. Some of the elements are zeros 1832-1836. These are compressed to the compressed block and chunks 1840. The new compressed block has only 3 compressed chunks 1852-1856. The zeros 1832-1836 has been removed. There are masks 1860 to indicate the corresponding elements is zero or non-zeros. Each mask can use 1 bit to represent this. However, those skilled in the art will recognize that each mask is not limited to using 1 bit to represent this. For this case, the mask value may be represented as 0x935b. Then, the original masks is passed to the compressed format 1840. This information may be packed into any chuck 1852-1856. The original masks may be packed at the end of the data 1870. The masks may also be placed inside the remapping table, as illustrated in FIG. 8. The kind of information that is used in not limited as long as the masks or values represent the location of original zero and non-zeros. A few bits or numbers may be used to indicate the locations of zeros or non-zeros within this block or chunk. However, block divides are not limited just 4 chunks.

FIG. 8 illustrates uncompressed and compressed data flow, in accordance with an embodiment of the present invention. In the uncompressed and compressed data flow 1900 shown in FIG. 8, a normal memory read operation 1902 and write operation 1904 is shown on the left side. For write operations 1904, an address 1912 and associated data 1914 is needed, then memory 1920 is written to based on the address 1912. For read operations 1902, an address 1932 is sent to read a block of data 1934.

On the right side, for write operations 1952, a request is sent with a write address 1962 and write data 1964. The write address 1962 will be remapping 1970 to a new address with a length to indicate new length of compressed data. The write data will be compressed into the variable length of data. Then, the new address is written to the compressed data 1972. For read operations 1954, the address is sent to the remapping table 1970, where the length of the data can also be calculated based on the location of current block and the location of next block. Alternatively, the length of the data may be calculated based on bitmasks if it is stored in remapping table 1970. Then, the new address with the length request is sent to memory 1972. The memory controller will send back the variable data with the requested length.

The compressed chucks are packed together in memory 1972 to save the memory storage. The memory saving is from original 16 chucks to 10 chunks, where the savings is 6/16=37.5%. In order to save the memory storage, a remapping table 1970 is needed to map to new address. In this remapping table 1970, the block's new location address is provided, which is called blk0_new_loc, block1_new_loc, block2_new_loc and block3_new_loc. The block's new location address can be a full address or partial bits of an address to indicate the block location. Besides the packed chuck and block location, the bitmasks is used to indicate the zero or non-zeros location of original chunks. This may be stored in the remapping table or compressed chunks. In addition, a flag is used to indicate that successful compression. Within a block, if most of elements are non-zeros, there is no advantage to compress this block. If the block is still to be compressed, another cost is required for bitmasks. Thus, it could surpass the original memory storage. So, if it is not worth to compress that block, one bit may be used to indicate the corresponding block is compressed.

The remapping table 1970 can be FIFOs, registers or caches, a memory or any storage. The remapping table 1970 information may be separated into several different storages. For example, the remapping table can have a new address table as a table, bit masks in another SRAM and flags in TAGS registers. The non-zeros value are only stored into the packed data format. A zero may be renamed into another name or a delta value may be added and the element which has the delta value may be skipped. For instance, "zero" can represent an offset value like "−128" value or a "symbol". It is also in our scope of invention. When you have value "−128" or a symbol, you also treated it as "zero" to do compression scheme as we have. It is not limited to value "−128", it also applies to any fixed value that you use mask-based encoding and decoding. The mask can also be a value, like mask value "1" to represent "zero", mask value "0" to represent "not zero". We can also use multiple bits (not just one bit) or a symbol or lookup table to represent the mask.

Figure 9:
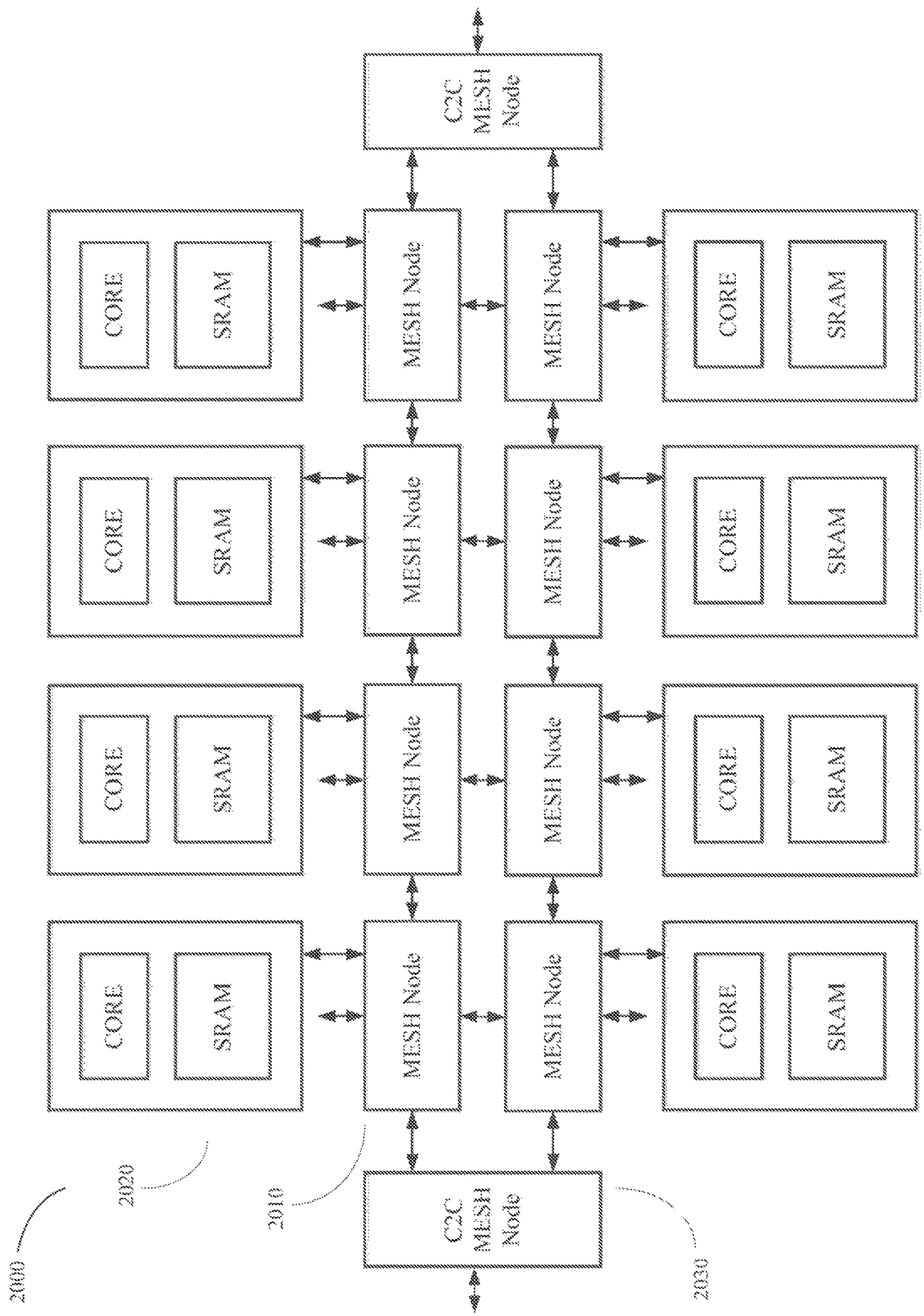
FIG. 9 illustrates the use of the mesh interconnect to connect between cores inside the SOC, in accordance with an embodiment of the present invention.

FIG. 9 illustrates the use of the mesh interconnect to connect between cores inside the SOC (system-on-a-chip), in accordance with an embodiment of the present invention. A SOC is an integrated circuit that integrates all components of a computer or other electronic system. In other words, a SOC is an integrated computer processing element. The core on the SOC may be CPU/GPU/Accelerators (see FIG. 5 and FIG. 6). In the mesh interconnect 2000 shown in FIG. 9, each mesh can connect to 4 mesh nodes 2010 and 1 core 2020. Thus, there are 5 connection in each mesh. Beside the mesh node, it also can connect to C2C (chip-to-chip) Mesh 2030 using a C2C interconnect connection.

Figure 10:
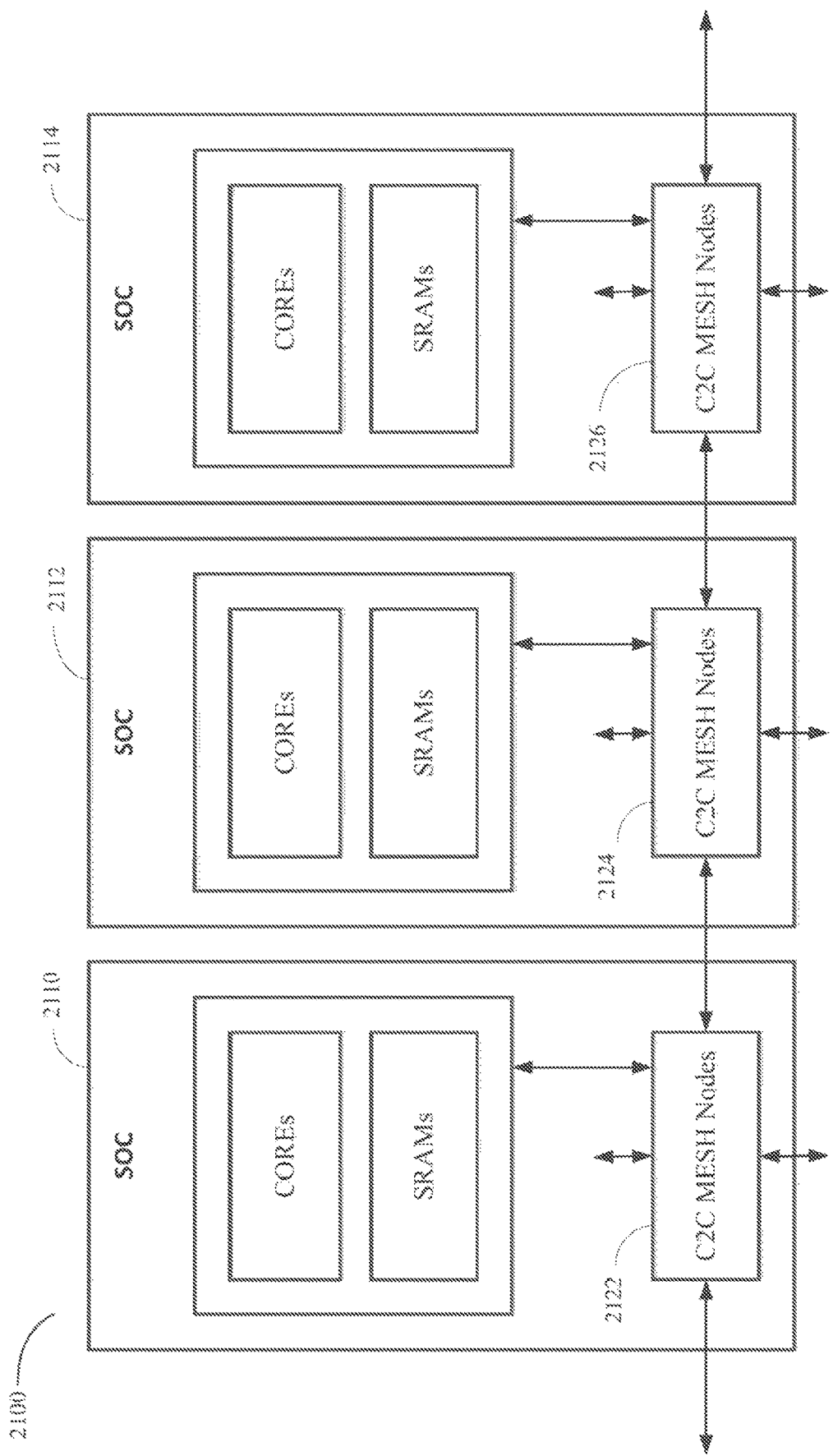
FIG. 10 illustrates the SOC chip connected to the other SOC chip through C2C (chip-to-chip) interconnect, in accordance with an embodiment of the present invention.

FIG. 10 illustrates the SOC system, in accordance with an embodiment of the present invention. In the SOC system 2100 shown FIG. 10, a SOC chip 2110 is connected to the other SOC chips 2112-2114 through C2C (chip-to-chip) mesh nodes 2122-2126 forming a C2C interconnect. The C2C is a bi-direction data and information communication.

Figure 11:
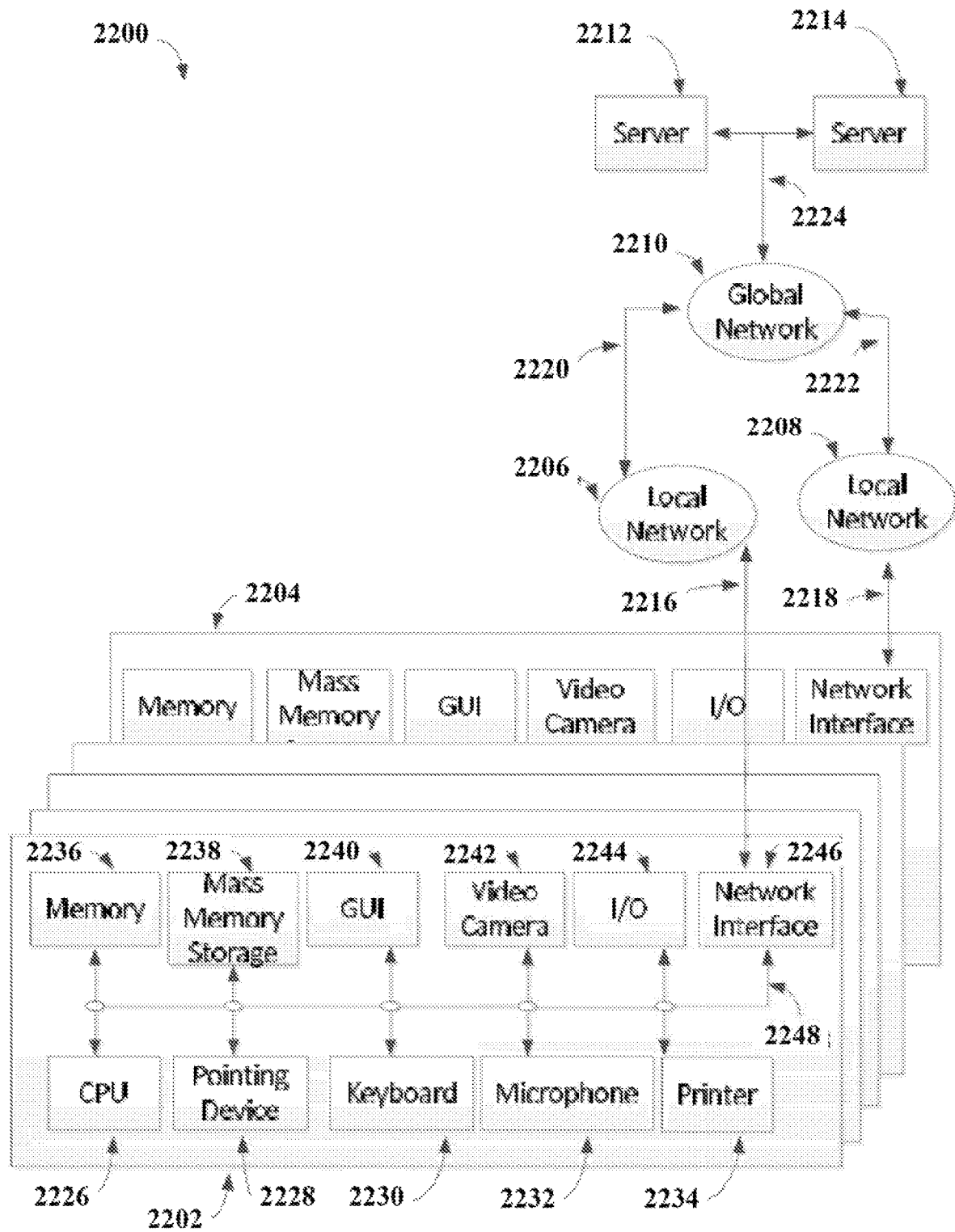
FIG. 11 is a block diagram depicting an exemplary client/server system which may be used by an exemplary web-enabled/networked embodiment of the present invention.

FIG. 11 is a block diagram depicting an exemplary client/server system which may be used by an exemplary web-enabled/networked embodiment of the present invention.

A communication system 2200 includes a multiplicity of clients with a sampling of clients denoted as a client 2202 and a client 2204, a multiplicity of local networks with a sampling of networks denoted as a local network 2206 and a local network 2208, a global network 2210 and a multiplicity of servers with a sampling of servers denoted as a server 2212 and a server 2214.

Client 2202 may communicate bi-directionally with local network 2206 via a communication channel 2216. Client 2204 may communicate bi-directionally with local network 2208 via a communication channel 2218. Local network 2206 may communicate bi-directionally with global network 2210 via a communication channel 2220. Local network 2208 may communicate bi-directionally with global network 2210 via a communication channel 2222. Global network 2210 may communicate bi-directionally with server 2212 and server 2214 via a communication channel 2224. Server 2212 and server 2214 may communicate bi-directionally with each other via communication channel 2224. Furthermore, clients 2202, 2204, local networks 2206, 2208, global network 2210 and servers 2212, 2214 may each communicate bi-directionally with each other.

In one embodiment, global network 2210 may operate as the Internet. It will be understood by those skilled in the art that communication system 2200 may take many different forms. Non-limiting examples of forms for communication system 2200 include local area networks (LANs), wide area networks (WANs), wired telephone networks, wireless networks, or any other network supporting data communication between respective entities.

Clients 2202 and 2204 may take many different forms. Non-limiting examples of clients 2202 and 2204 include personal computers, personal digital assistants (PDAs), cellular phones and smartphones.

Client 2202 includes a CPU 2226, a pointing device 2228, a keyboard 2230, a microphone 2232, a printer 2234, a memory 2236, a mass memory storage 2238, a GUI 2240, a video camera 2242, an input/output interface 2244 and a network interface 2246.

CPU 2226, pointing device 2228, keyboard 2230, microphone 2232, printer 2234, memory 2236, mass memory storage 2238, GUI 2240, video camera 2242, input/output interface 2244 and network interface 2246 may communicate in a unidirectional manner or a bi-directional manner with each other via a communication channel 2248. Communication channel 2248 may be configured as a single communication channel or a multiplicity of communication channels.

CPU 2226 may be comprised of a single processor or multiple processors. CPU 2226 may be of various types including micro-controllers (e.g., with embedded RAM/ROM) and microprocessors such as programmable devices (e.g., RISC or SISC based, or CPLDs and FPGAs) and devices not capable of being programmed such as gate array ASICs (Application Specific Integrated Circuits) or general purpose microprocessors.

As is well known in the art, memory 2236 is used typically to transfer data and instructions to CPU 2226 in a bi-directional manner. Memory 2236, as discussed previously, may include any suitable computer-readable media, intended for data storage, such as those described above excluding any wired or wireless transmissions unless specifically noted. Mass memory storage 2238 may also be coupled bi-directionally to CPU 2226 and provides additional data storage capacity and may include any of the computer-readable media described above. Mass memory storage 2238 may be used to store programs, data and the like and is typically a secondary storage medium such as a hard disk. It will be appreciated that the information retained within mass memory storage 2238, may, in appropriate cases, be incorporated in standard fashion as part of memory 2236 as virtual memory.

CPU 2226 may be coupled to GUI 2240. GUI 2240 enables a user to view the operation of computer operating system and software. CPU 2226 may be coupled to pointing device 2228. Non-limiting examples of pointing device 2228 include computer mouse, trackball and touchpad. Pointing device 2228 enables a user with the capability to maneuver a computer cursor about the viewing area of GUI 2240 and select areas or features in the viewing area of GUI 2240. CPU 2226 may be coupled to keyboard 2230. Keyboard 2230 enables a user with the capability to input alphanumeric textual information to CPU 2226. CPU 2226 may be coupled to microphone 2232. Microphone 2232 enables audio produced by a user to be recorded, processed and communicated by CPU 2226. CPU 2226 may be connected to printer 2234. Printer 2234 enables a user with the capability to print information to a sheet of paper. CPU 2226 may be connected to video camera 2242. Video camera 2242 enables video produced or captured by user to be recorded, processed and communicated by CPU 2226.

CPU 2226 may also be coupled to input/output interface 2244 that connects to one or more input/output devices such as such as CD-ROM, video monitors, track balls, mice, keyboards, microphones, touch-sensitive displays, transducer card readers, magnetic or paper tape readers, tablets, styluses, voice or handwriting recognizers, or other well-known input devices such as, of course, other computers.

Finally, CPU 2226 optionally may be coupled to network interface 2246 which enables communication with an external device such as a database or a computer or telecommunications or internet network using an external connection shown generally as communication channel 2216, which may be implemented as a hardwired or wireless communications link using suitable conventional technologies. With such a connection, CPU 2226 might receive information from the network, or might output information to a network in the course of performing the method steps described in the teachings of the present invention.

It will be further apparent to those skilled in the art that at least a portion of the novel method steps and/or system components of the present invention may be practiced and/or located in location(s) possibly outside the jurisdiction of the United States of America (USA), whereby it will be accordingly readily recognized that at least a subset of the novel method steps and/or system components in the foregoing embodiments must be practiced within the jurisdiction of the USA for the benefit of an entity therein or to achieve an object of the present invention. Thus, some alternate embodiments of the present invention may be configured to comprise a smaller subset of the foregoing means for and/or steps described that the applications designer will selectively decide, depending upon the practical considerations of the particular implementation, to carry out and/or locate within the jurisdiction of the USA. For example, any of the foregoing described method steps and/or system components which may be performed remotely over a network (e.g., without limitation, a remotely located server) may be performed and/or located outside of the jurisdiction of the USA while the remaining method steps and/or system components (e.g., without limitation, a locally located client) of the forgoing embodiments are typically required to be located/performed in the USA for practical considerations. In client-server architectures, a remotely located server typically generates and transmits required information to a US based client, for use according to the teachings of the present invention. Depending upon the needs of the particular application, it will be readily apparent to those skilled in the art, in light of the teachings of the present invention, which aspects of the present invention can or should be located locally and which can or should be located remotely. Thus, for any claims construction of the following claim limitations that are construed under 35 USC § 112 (6) it is intended that the corresponding means for and/or steps for carrying out the claimed function are the ones that are locally implemented within the jurisdiction of the USA, while the remaining aspect(s) performed or located remotely outside the USA are not intended to be construed under 35 USC § 112 (6). In some embodiments, the methods and/or system components which may be located and/or performed remotely include, without limitation: It is noted that according to USA law, all claims must be set forth as a coherent, cooperating set of limitations that work in functional combination to achieve a useful result as a whole. Accordingly, for any claim having functional limitations interpreted under 35 USC § 112 (6) where the embodiment in question is implemented as a client-server system with a remote server located outside of the USA, each such recited function is intended to mean the function of combining, in a logical manner, the information of that claim limitation with at least one other limitation of the claim. For example, in client-server systems where certain information claimed under 35 USC § 112 (6) is/(are) dependent on one or more remote servers located outside the USA, it is intended that each such recited function under 35 USC § 112 (6) is to be interpreted as the function of the local system receiving the remotely generated information required by a locally implemented claim limitation, wherein the structures and or steps which enable, and breathe life into the expression of such functions claimed under 35 USC § 112 (6) are the corresponding steps and/or means located within the jurisdiction of the USA that receive and deliver that information to the client (e.g., without limitation, client-side processing and transmission networks in the USA). When this application is prosecuted or patented under a jurisdiction other than the USA, then "USA" in the foregoing should be replaced with the pertinent country or countries or legal organization(s) having enforceable patent infringement jurisdiction over the present application, and "35 USC § 112 (6)" should be replaced with the closest corresponding statute in the patent laws of such pertinent country or countries or legal organization(s).

All the features disclosed in this specification, including any accompanying abstract and drawings, may be replaced by alternative features serving the same, equivalent or similar purpose, unless expressly stated otherwise. Thus, unless expressly stated otherwise, each feature disclosed is one example only of a generic series of equivalent or similar features.

It is noted that according to USA law 35 USC § 112 (1), all claims must be supported by sufficient disclosure in the present patent specification, and any material known to those skilled in the art need not be explicitly disclosed. However, 35 USC § 112 (6) requires that structures corresponding to functional limitations interpreted under 35 USC § 112 (6) must be explicitly disclosed in the patent specification. Moreover, the USPTO's Examination policy of initially treating and searching prior art under the broadest interpretation of a "mean for" claim limitation implies that the broadest initial search on 112(6) functional limitation would have to be conducted to support a legally valid Examination on that USPTO policy for broadest interpretation of "mean for" claims. Accordingly, the USPTO will have discovered a multiplicity of prior art documents including disclosure of specific structures and elements which are suitable to act as corresponding structures to satisfy all functional limitations in the below claims that are interpreted under 35 USC § 112 (6) when such corresponding structures are not explicitly disclosed in the foregoing patent specification. Therefore, for any invention element(s)/structure(s) corresponding to functional claim limitation(s), in the below claims interpreted under 35 USC § 112 (6), which is/are not explicitly disclosed in the foregoing patent specification, yet do exist in the patent and/or non-patent documents found during the course of USPTO searching, Applicant(s) incorporate all such functionally corresponding structures and related enabling material herein by reference for the purpose of providing explicit structures that implement the functional means claimed. Applicant(s) request(s) that fact finders during any claims construction proceedings and/or examination of patent allowability properly identify and incorporate only the portions of each of these documents discovered during the broadest interpretation search of 35 USC § 112 (6) limitation, which exist in at least one of the patent and/or non-patent documents found during the course of normal USPTO searching and or supplied to the USPTO during prosecution. Applicant(s) also incorporate by reference the bibliographic citation information to identify all such documents comprising functionally corresponding structures and related enabling material as listed in any PTO Form-892 or likewise any information disclosure statements (IDS) entered into the present patent application by the USPTO or Applicant(s) or any $3^{rd}$ parties. Applicant(s) also reserve its right to later amend the present application to explicitly include citations to such documents and/or explicitly include the functionally corresponding structures which were incorporate by reference above.

Thus, for any invention element(s)/structure(s) corresponding to functional claim limitation(s), in the below claims, that are interpreted under 35 USC § 112 (6), which is/are not explicitly disclosed in the foregoing patent specification, Applicant(s) have explicitly prescribed which documents and material to include the otherwise missing disclosure, and have prescribed exactly which portions of such patent and/or non-patent documents should be incorporated by such reference for the purpose of satisfying the disclosure requirements of 35 USC § 112 (6). Applicant(s) note that all the identified documents above which are incorporated by reference to satisfy 35 USC § 112 (6) necessarily have a filing and/or publication date prior to that of the instant application, and thus are valid prior documents to incorporated by reference in the instant application.

Having fully described at least one embodiment of the present invention, other equivalent or alternative methods of implementing machine learning systems according to the present invention will be apparent to those skilled in the art. Various aspects of the invention have been described above by way of illustration, and the specific embodiments disclosed are not intended to limit the invention to the particular forms disclosed. The particular implementation of the machine learning systems may vary depending upon the particular context or application. By way of example, and not limitation, the machine learning systems described in the foregoing were principally directed to point of sale systems implementations; however, similar techniques may instead be applied to automated manufacturing systems and warehouse systems, which implementations of the present invention are contemplated as within the scope of the present invention. The invention is thus to cover all modifications, equivalents, and alternatives falling within the spirit and scope of the following claims. It is to be further understood that not all of the disclosed embodiments in the foregoing specification will necessarily satisfy or achieve each of the objects, advantages, or improvements described in the foregoing specification.

Claim elements and steps herein may have been numbered and/or lettered solely as an aid in readability and understanding. Any such numbering and lettering in itself is not intended to and should not be taken to indicate the ordering of elements and/or steps in the claims.

The corresponding structures, materials, acts, and equivalents of all means or step plus function elements in the claims below are intended to include any structure, material, or act for performing the function in combination with other claimed elements as specifically claimed.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The Abstract is provided to comply with 37 C.F.R. Section 1.72(b) requiring an abstract that will allow the reader to ascertain the nature and gist of the technical disclosure. That is, the Abstract is provided merely to introduce certain concepts and not to identify any key or essential features of the claimed subject matter. It is submitted with the understanding that it will not be used to limit or interpret the scope or meaning of the claims.

The following claims are hereby incorporated into the detailed description, with each claim standing on its own as a separate embodiment.

What is claimed is:

1. A non-transitory computer-readable storage medium with an executable program stored thereon, wherein the program instructs one or more processors to perform a method, the method comprising the steps of:

defining or assigning a first one or more masks to be operable for identifying one or more positions of one or more data elements having a zero value in one of more data chunks;

defining or assigning a second one or more masks to be operable for identifying one or more positions of one or more data elements having a non-zero value in the one or more data chunks;

packing the one or more data chunks into a data block;

storing the data block in memory;

accessing the one or more data chunks identifying the one or more data elements;

using the first one or more masks to identify the position of each of the one or more data elements having zero values;

using the second set of one or more masks to identify the position of each the one or more data elements having non-zero values;

processing the one or more data elements having zero values based on the identified position of the first set of one or more masks processing the one or more data elements having non-zero values based on the identified position of the second set of one or more masks;
removing the one or more data elements having zero values from the identified position of the first one or more masks;
compressing the one or more data elements having non-zero values into a compressed data block.

2. The method of claim 1, wherein the step of processing the one or more data elements further comprises the steps of:
determining the number of data elements having zero values based on the first one or more masks
determining the number of data elements having non-zero values based on the second one or more masks;
accessing the first one or more masks to identify the position of the one or more data elements having zero values; and
accessing the second one or more masks to identify the position of the one or more data elements having non-zero values
storing the compressed data block in a memory.

3. The method of claim 1, wherein the step of processing the one or more data elements further comprises the steps of:
accessing the one or more data chunks in the compressed data block stored in memory;
adding zero-value data elements in various positions in the one or more data chunks according to one or more masks to form an uncompressed data block; and
storing the uncompressed data.

4. The method of claim 1, in which the step of processing the one or more data elements further comprises the step of decompressing the one or more data elements.

5. The method of claim 1, further comprises the step of compressing the one or more data elements.

6. The method of claim 1, further comprising the step of remapping, using at least one of a remapping table, and an address of a block of at least one or more data elements to new address.

7. The method of claim 1, further comprising the step of aggregating the compressed data chunks into a block of data chunks having a predetermined length.

8. The method of claim 1, further comprising the step of associating a flag with the compressed data block to indicate that the data block is compressed.

9. The method of claim 1, in which the compressed data block comprises a partial block of data chunks having a predetermined chunk size.

10. The method of claim 1, in which the decompressed data comprises data chunks having a predetermined chunk size.

11. The method of claim 1, in which the one or more data chunks are separated from a block.

12. The method of claim 1, in which the compressed data elements are stored in memory, the memory comprising at least one of an SRAM, a DRAM, and an MRAM.

13. The method of claim 1, further comprising the step of forming a C2C (chip-to-chip) interconnect using a C2C mesh node, in which said C2C mesh node is a bi-directional data and information communication.

14. A system comprising:
a plurality of integrated computer processing elements that include:
a core module for processing data; and
a memory module;
wherein the plurality of integrated computer processing elements are interconnected by a mesh interconnect to provide inter-communication between the plurality of integrated computer processing modules, and
wherein the core module is configured to:
access one or more data chunks identifying data elements;
use a first one or more masks to identify a position of the data elements having zero values;
use a second one or more masks to identify a position of the data elements having non-zero values;
process the data elements based on the first one or more masks identifying the position of the data elements having zero values;
process the data elements based on the second one or more masks identifying the position of the data elements having non-zero value
remove each of the data elements having zero value from the one or more data chunks based on the first one or more masks identifying the position of each of the data elements having zero value; and
compress the data elements having non-zero values to form a compressed data block.

15. The system of claim 14, wherein the core module processes the data elements by:
determining the position of the one or more data elements having zero values and the position of the one or more data elements having non-zero values;
accessing the first one or more masks to identify the position of the data elements in the one or more data chunks having zero values and a position of the data elements in the one or more data chunks having non-zero values;
and
storing the compressed data block in the memory module.

16. The system of claim 14, wherein the core module processes the data elements by:
accessing the compressed data block;
adding zero-value data elements in various positions in the one or more data chunks according to one or more masks to form an uncompressed data block; and
storing the uncompressed data block in the memory.

17. The system of claim 14, in which the core module comprises at least one of a CPU, a GPU, and an accelerator.

18. A method executed by one or more processors, where the executed method is based on instructions stored on a non-transitory computer-readable storage medium, the method comprising the steps of:
accessing one or more data chunks identifying data elements
using one or more masks to identify a position of each of the data elements having a zero value and a position of each of the data elements having non-zero values in the one or more data chunks;
processing the data elements based on the one or more masks identifying the position of the data elements having zero values and the position of the data elements having non-zero values
removing each of the data elements with zero value in the one or more data chunks, wherein the position of each of the data elements with zero value is identified by the one or more masks; and
compressing the one or more data chunks identifying data elements with non-zero values.

19. The method of claim 18, wherein the-processing the data elements further comprises the steps of:
determining data elements having zero values;
accessing the one or more masks to identify a position of each of the data elements having zero value in the one or more data chunks having zero values and a position of the data elements in the one or more data chunks having non-zero values; and storing the compressed data chunks identifying data elements with non-zero values in memory.

20. The method of claim 18, wherein the step of processing the data elements further comprises the steps of:

accessing the compressed data chunks stored in memory;

adding zero-value data elements in various positions in the one or more data chunks according to or identified by the one or more masks to form uncompressed one or more data chunks; and storing the uncompressed data chunks.

* * * * *